(12) United States Patent
Peng et al.

(10) Patent No.: US 10,340,141 B2
(45) Date of Patent: Jul. 2, 2019

(54) PATTERNING METHOD FOR SEMICONDUCTOR DEVICE AND STRUCTURES RESULTING THEREFROM

(71) Applicant: Taiwan Semiconductor Manufacturing Company, Ltd., Hsinchu (TW)

(72) Inventors: Tai-Yen Peng, Hsinchu (TW); Chao-Kuei Yeh, Changhua (TW); Ying-Hao Wu, Hsinchu (TW); Chih-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/641,009

(22) Filed: Jul. 3, 2017

(65) Prior Publication Data

US 2018/0315601 A1 Nov. 1, 2018

Related U.S. Application Data

(60) Provisional application No. 62/491,614, filed on Apr. 28, 2017.

(51) Int. Cl.
*H01L 21/033* (2006.01)
*H01L 21/311* (2006.01)
(Continued)

(52) U.S. Cl.
CPC ...... *H01L 21/0337* (2013.01); *H01L 21/0276* (2013.01); *H01L 21/0332* (2013.01); *H01L 21/3086* (2013.01); *H01L 21/3088* (2013.01); *H01L 21/311* (2013.01); *H01L 21/31111* (2013.01); *H01L 21/31116* (2013.01);
(Continued)

(58) Field of Classification Search
None
See application file for complete search history.

(56) References Cited

U.S. PATENT DOCUMENTS 8,728,332 B2  5/2014 Lin et al.
8,796,666 B1  8/2014 Huang et al.
(Continued)

OTHER PUBLICATIONS

J.S. Ponraj et al., Critical Reviews in Solid State and Materials Sciences, vol. 38, pp. 203-233 (Year: 2013).*
(Continued)

*Primary Examiner* — Jiong-Ping Lu
(74) *Attorney, Agent, or Firm* — Slater Matsil, LLP

(57) ABSTRACT

An embodiment method includes defining a first mandrel and a second mandrel over a hard mask layer. The method also includes depositing a spacer layer over and along sidewalls of the first mandrel and the second mandrel, and forming a sacrificial material over the spacer layer between the first mandrel and the second mandrel. The sacrificial material includes an inorganic oxide. The method further includes removing first horizontal portions of the spacer layer to expose the first mandrel and the second mandrel. Remaining portions of the spacer layer provide spacers on sidewalls of the first mandrel and the second mandrel. The method further includes removing the first mandrel and the second mandrel and patterning the hard mask layer using the spacers and the sacrificial material as an etch mask.

18 Claims, 48 Drawing Sheets

(51) Int. Cl.
  *H01L 21/027* (2006.01)
  *H01L 21/768* (2006.01)
  *H01L 21/308* (2006.01)
  *H01L 21/28* (2006.01)

(52) U.S. Cl.
  CPC .. *H01L 21/31138* (2013.01); *H01L 21/31144* (2013.01); *H01L 21/76816* (2013.01); *H01L 21/28123* (2013.01)

(56) References Cited

U.S. PATENT DOCUMENTS

| | | | |
|---|---|---|---|
| 8,822,243 B2 | 9/2014 | Yan et al. | |
| 8,987,142 B2 | 3/2015 | Lee et al. | |
| 9,053,279 B2 | 6/2015 | Chang et al. | |
| 9,093,530 B2 | 7/2015 | Huang et al. | |
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 2001/0031420 A1* | 10/2001 | Lee | C07F 7/1844 430/270.1 |
| 2006/0273456 A1* | 12/2006 | Sant | H01L 21/3086 257/734 |
| 2010/0009470 A1* | 1/2010 | Davis | B82Y 10/00 438/9 |
| 2014/0024209 A1* | 1/2014 | Jung | H01L 21/82345 438/595 |
| 2014/0087563 A1* | 3/2014 | Sant | H01L 21/3086 438/702 |
| 2015/0040077 A1* | 2/2015 | Ho | G03F 7/70433 716/51 |
| 2016/0035571 A1* | 2/2016 | Chang | H01L 21/0338 438/703 |

OTHER PUBLICATIONS

O.A. Shilova, Surface Coatings International Part B: Coatings Transactions, vol. 86, pp. 169-246. (Year: 2003).*

* cited by examiner

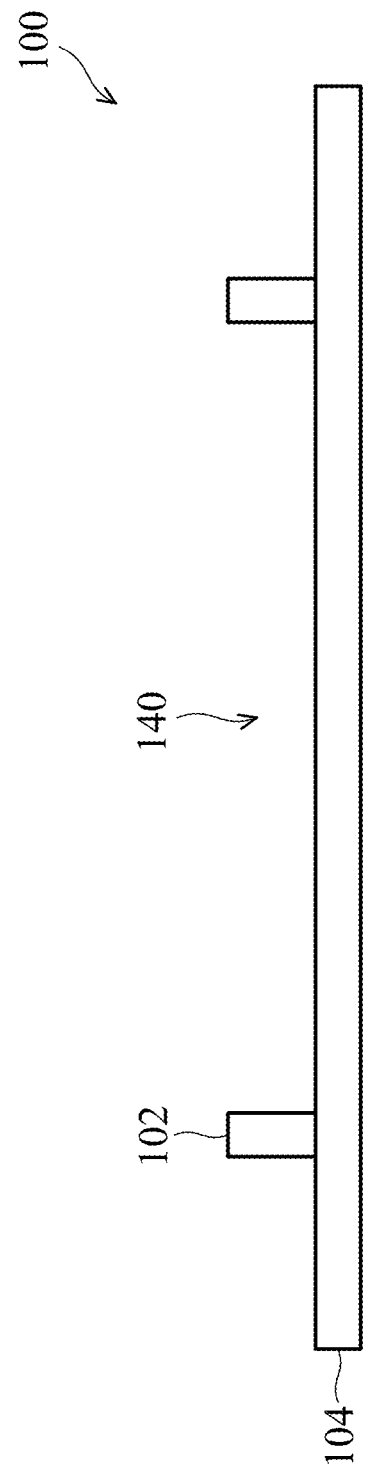

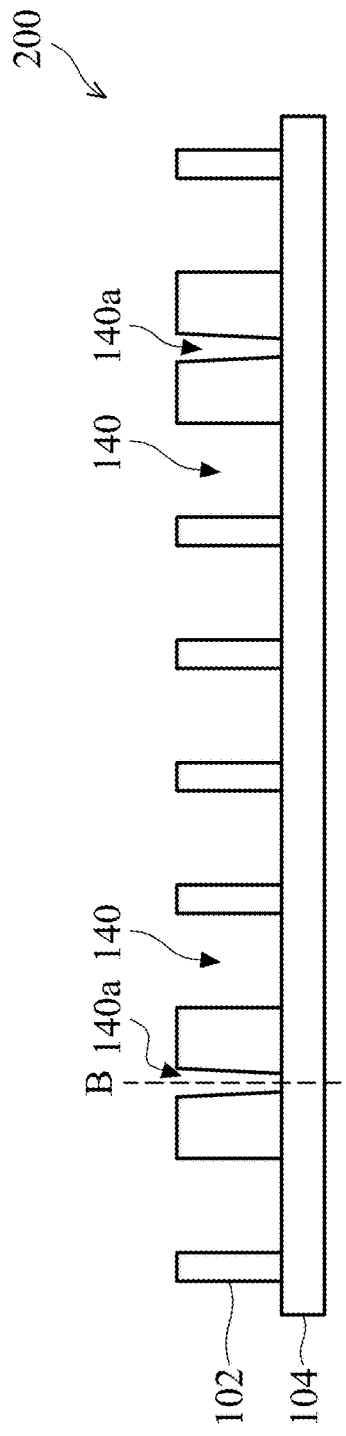
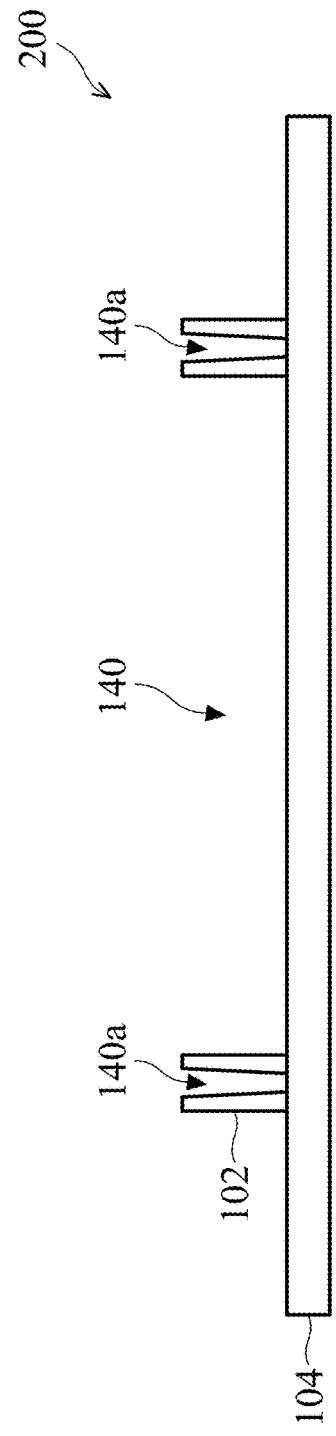

PATTERNING METHOD FOR SEMICONDUCTOR DEVICE AND STRUCTURES RESULTING THEREFROM

PRIORITY

This application claims the benefit of U.S. Provisional Application No. 62/491,614, filed on Apr. 28, 2017, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5, 6A, 6B, 7A, 7B, 8A, 8B, 9A, 9B, 10A, 10B, 11A, 11B, 12A, 12B, 13A, 13B, 14, 15A, 15B, 16A, 16B, 17A, and 17B illustrate cross-sectional views of various intermediary stages of manufacturing a semiconductor device in accordance with some embodiments.

FIGS. 21A, 21B, 22A, 22B, 23A, 23B, 24A, 24B, 25A, 25B, 26A, 26B, 27A, 27B, 28A, 28B, 29A, 29B, and 30 illustrate cross-sectional views of various intermediary stages of manufacturing a semiconductor device in accordance with some other embodiments.

DETAILED DESCRIPTION

Figure 1:
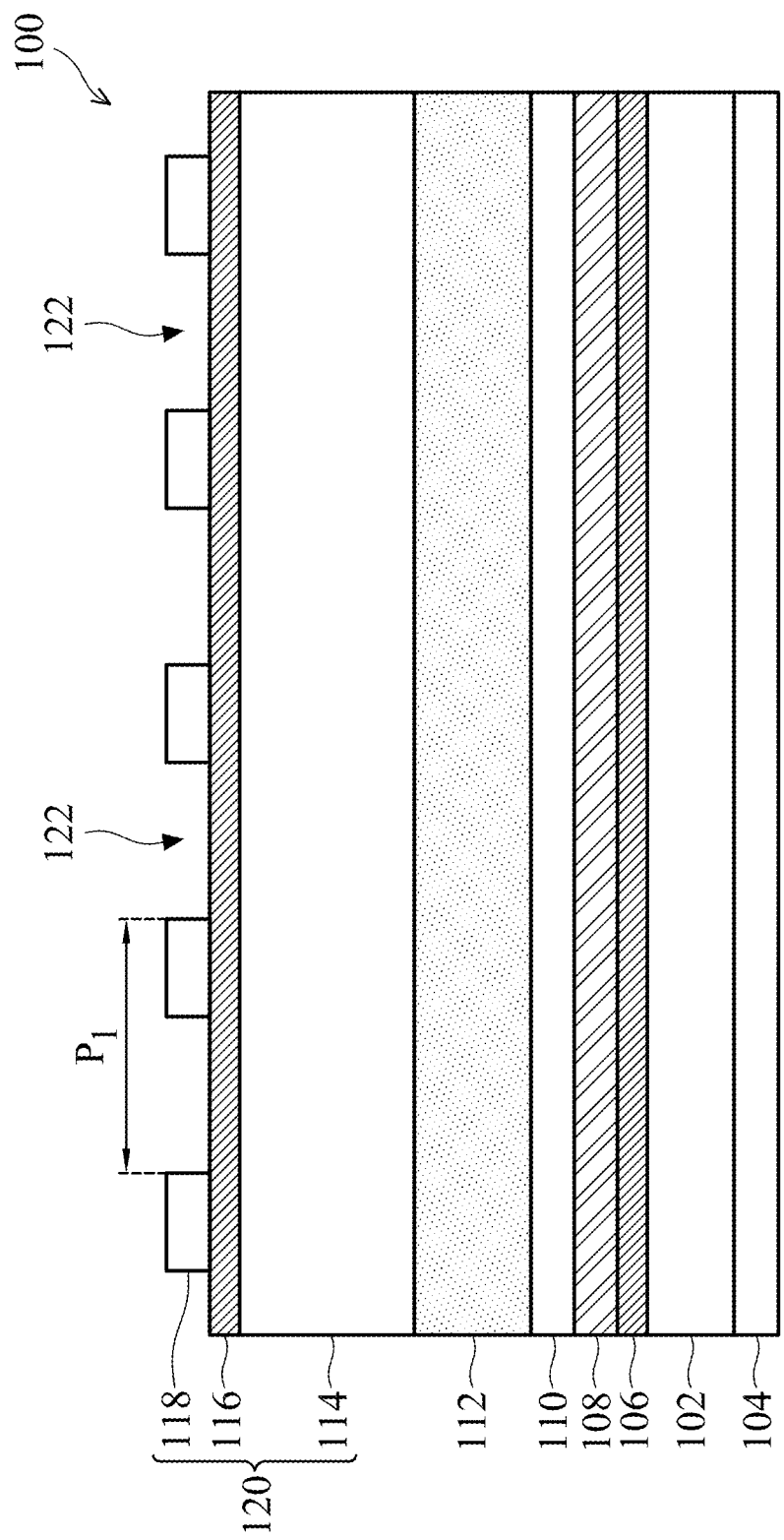

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a specifically patterning process, namely a self-aligned double patterning (SADP) process where mandrels are patterned, spacers are formed along sidewalls of the mandrels, and the mandrels are removed leaving the spacers to define a pattern at half a pitch of the mandrels. However, various embodiments may be directed at other patterning processes, such as, self-aligned quadruple patterning (SAQP), and the like.

A semiconductor device and method are provided in accordance with some embodiments. In particular, a self-aligned double patterning process is performed to pattern lines in a semiconductor device. The patterned lines have a pitch that is at least one half of a minimum pitch achievable using photolithographic processes. Patterned lines are defined between adjacent sidewalls of spacers, and a patterned sacrificial material (sometimes referred to as a reverse material) is formed in the patterned lines. The sacrificial material may comprise an inorganic material, which is formed by patterning openings in a mask (the openings exposing selected areas of the patterned lines) and depositing the inorganic material in the openings using a suitable film deposition process, such as chemical vapor deposition (CVD), physical vapor deposition (PVD), atomic layer deposition (ALD), and the like. After the sacrificial material is formed, the spacers and the sacrificial material are used to pattern an underlying mask layer, which is in turn used to pattern a target layer. The underlying target layer may be a layer used for a variety of purposes. For example, the target layer may be a low-k dielectric layer, in which openings are patterned using the mask layer. Subsequently, conductive material(s) may be filled in the openings of the low-k dielectric layer to define interconnect lines. The interconnect lines may have a finer pitch than is achievable using photolithographic processes alone. Compared to organic sacrificial materials formed using a spin-on process, embodiment deposition processes of inorganic materials results in improved definition of the sacrificial material with fewer defects (e.g., less bubbling). Thus, fine pitched semiconductor structures can be manufactured with improved yield.

FIGS. 1 through 17B illustrate cross-sectional views of intermediate stages in the formation of features in a target layer 102 on a semiconductor device 100, in accordance with some exemplary embodiments. The target layer 102 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is an intermetal dielectric (IMD) layer. In such embodiments, the target layer 102 comprises a low-k dielectric material having a dielectric constant (k value) lower than 3.8, lower than about 3.0, or lower than about 2.5, for example. In alternative embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 102 is a conductive layer, such as, a metal layer or a polysilicon layer, which is blanket deposited. Embodiment patterning processes may be applied to the target layer 102 in order to pattern semiconductor gates and/or dummy gates of finFETS. By using embodiment processes to pattern a conductive target layer 102, spacing between adjacent gates may be reduced and gate density may be increased.

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer and may act as a stop for an etching process subsequently performed on the target layer 102. The material and process used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like.

The film stack further includes an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). The ARC 106 may be formed by Plasma Enhance Chemical Vapor Deposition (PECVD), High-Density Plasma (HDP) deposition, or the like.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), and may be formed by PVD, Radio Frequency PVD (RFPVD), Atomic Layer Deposition (ALD), or the like. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes a dielectric layer 110 formed over the hard mask layer 108. The dielectric layer 110 may be formed from a silicon oxide, such as borophosphosilicate tetraethylortho silicate (B PTE OS) or undoped tetraethylorthosilicate (TEOS) oxide, and may be formed by CVD, ALD, spin-on coating, or the like. In some embodiments, the dielectric layer 110 acts as an etch stop layer for patterning subsequently formed mandrels and/or spacers (e.g., mandrels 124, see FIG. 4, and spacers 127, see FIG. 13A). In some embodiments, the dielectric layer 110 also acts as an anti-reflective coating.

The film stack further includes a mandrel layer 112 formed over the first dielectric hard mask layer 108. The first mandrel layer 112 may be formed of a semiconductor such as amorphous silicon, polysilicon, silicon nitride, silicon oxide, or another material that has a high etching selectivity with the underlying layer, e.g., with the dielectric layer 110.

A tri-layer photoresist 120 is formed on the film stack over the mandrel layer 112. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer. The middle layer 116 may comprise an inorganic material, which may be a nitride (such as silicon nitride), an oxynitride (such as silicon oxynitride), an oxide (such as silicon oxide), or the like. The middle layer 116 has a high etching selectivity relative to the upper layer 118 and the bottom layer 114. The various layers of the tri-layer photoresist 120 may be blanket deposited sequentially using, for example, spin-on processes. Although a tri-layer photoresist 120 is discussed herein, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the mandrel layer 112. For example, in advanced extreme ultraviolet (EUV) lithography processes, a monolayer or bilayer photoresist 120 may be used.

In some embodiments, the upper layer 118 is patterned using a photolithographic process. Subsequently, the upper layer 118 is used as an etching mask for patterning of the middle layer 116 (see FIG. 2). The middle layer 116 is then used as an etching mask for patterning of the bottom layer 114, and the bottom layer 114 is then used to pattern the mandrel layer 112 (see FIGS. 3 and 4). It has been observed that by using a tri-layer photoresist (e.g., tri-layer photoresist 120) to etch a target layer (e.g., mandrel layer 112), improved definition in fine-pitched patterns can be achieved in the target layer (e.g., mandrel layer 112).

The upper layer 118 is patterned using any suitable photolithography process to form openings 122 therein. As an example of patterning openings 122 in the upper layer 118, a photomask (not shown) may be disposed over the upper layer 118. The upper layer 118 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the top photoresist layer may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used. The openings 122 may have strip shapes in a plan view (not illustrated). The pitch $P_1$ of the openings 122 may be the minimum pitch achievable using photolithographic processes alone. For example, in some embodiments, the pitch $P_1$ of the openings 122 is about 80 nm. Other pitches $P_1$ of the openings 122 are also contemplated.

Figure 2:
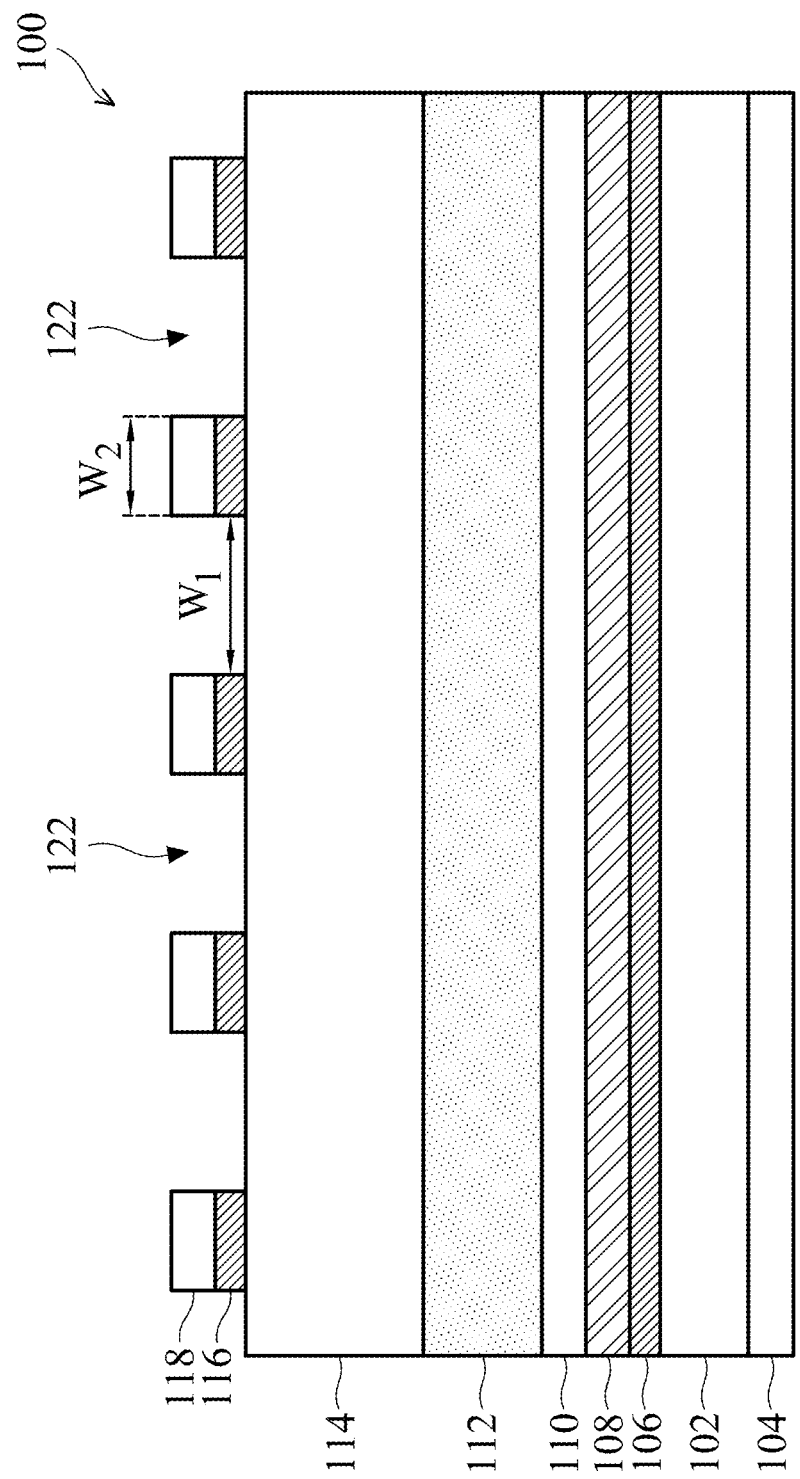

After the patterning of the upper layer 118, the pattern of the upper layer 118 is transferred to the middle layer 116 in an etching process. The etching process is anisotropic, so that the openings 122 in the upper layer 118 are extended through the middle layer 116 and have about the same sizes in the middle layer 116 as they do in the upper layer 118. The resulting structure is illustrated in FIG. 2.

Optionally, a trimming process (not illustrated) may be performed to increase the size of the openings 122 in the middle layer 116. In an embodiment, the trimming process is an anisotropic plasma etch process with process gases including $O_2$, $CO_2$, $N_2/H_2$, $H_2$, the like, a combination thereof, or any other gases suitable for trimming the middle layer 116. The trimming may increase the width $W_1$ of the openings 122 and decrease the width $W_2$ of the portions of the middle layer 116 between the openings 122. The trimming process may be performed in order to achieve a desired ratio of the width $W_1$ to the width $W_2$ so that subsequently defined lines are uniformly spaced. In other embodiments, the middle layer 116 is initially patterned to have a desired ratio of the width $W_1$ to the width $W_2$ and the trimming process may be omitted.

Figure 3:
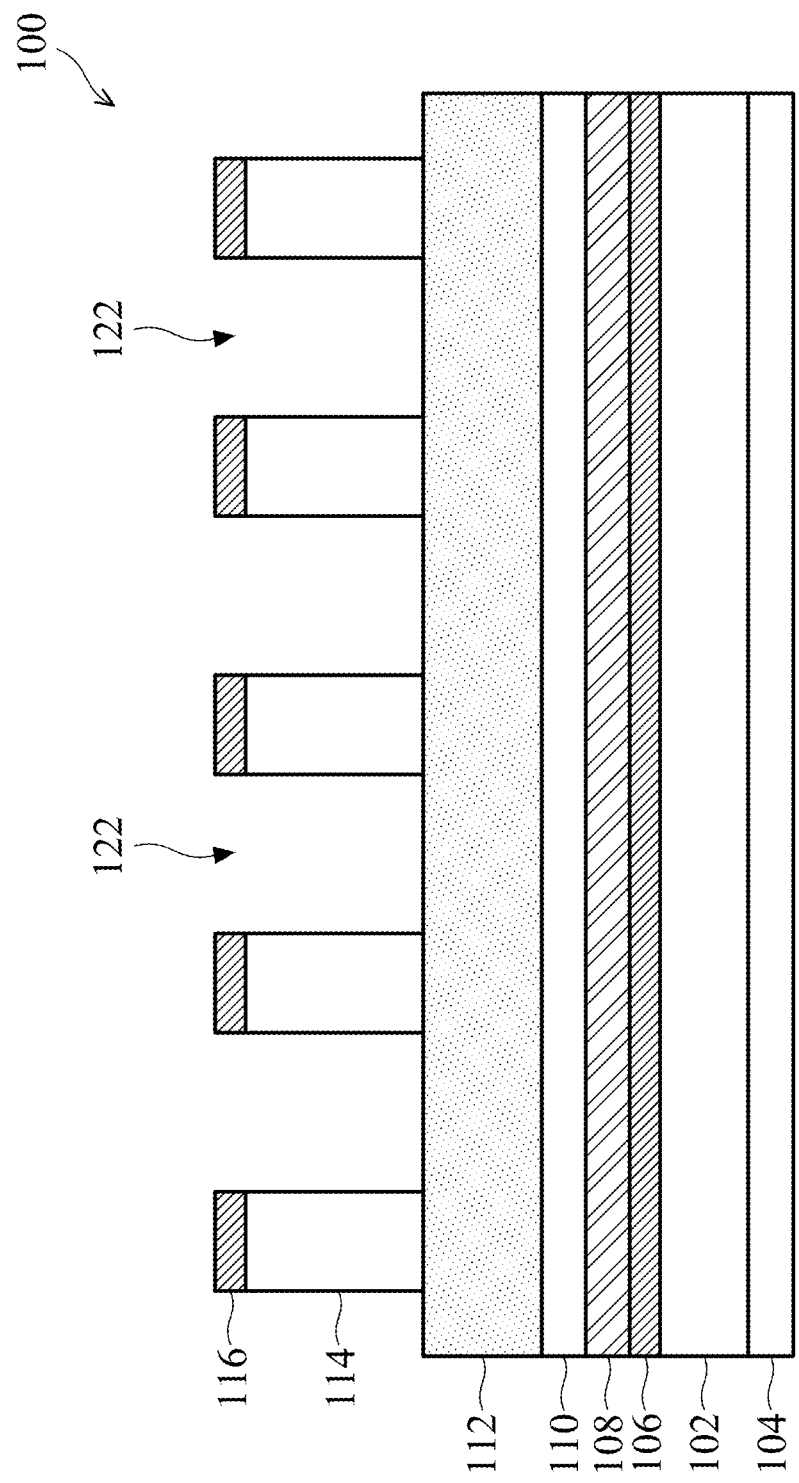

In FIG. 3, an etching process is performed to transfer the pattern of the middle layer 116 to the bottom layer 114, thereby extending the openings 122 through the bottom layer 114. The etching process of the bottom layer 114 is anisotropic, so that the openings 122 in the middle layer 116 are extended through the bottom layer 114 and have about the same sizes in the middle layer 116 as they do in the bottom layer 114. As part of etching the bottom layer 114, the upper layer 118 (see FIGS. 1 and 2) may be consumed.

Figure 4:
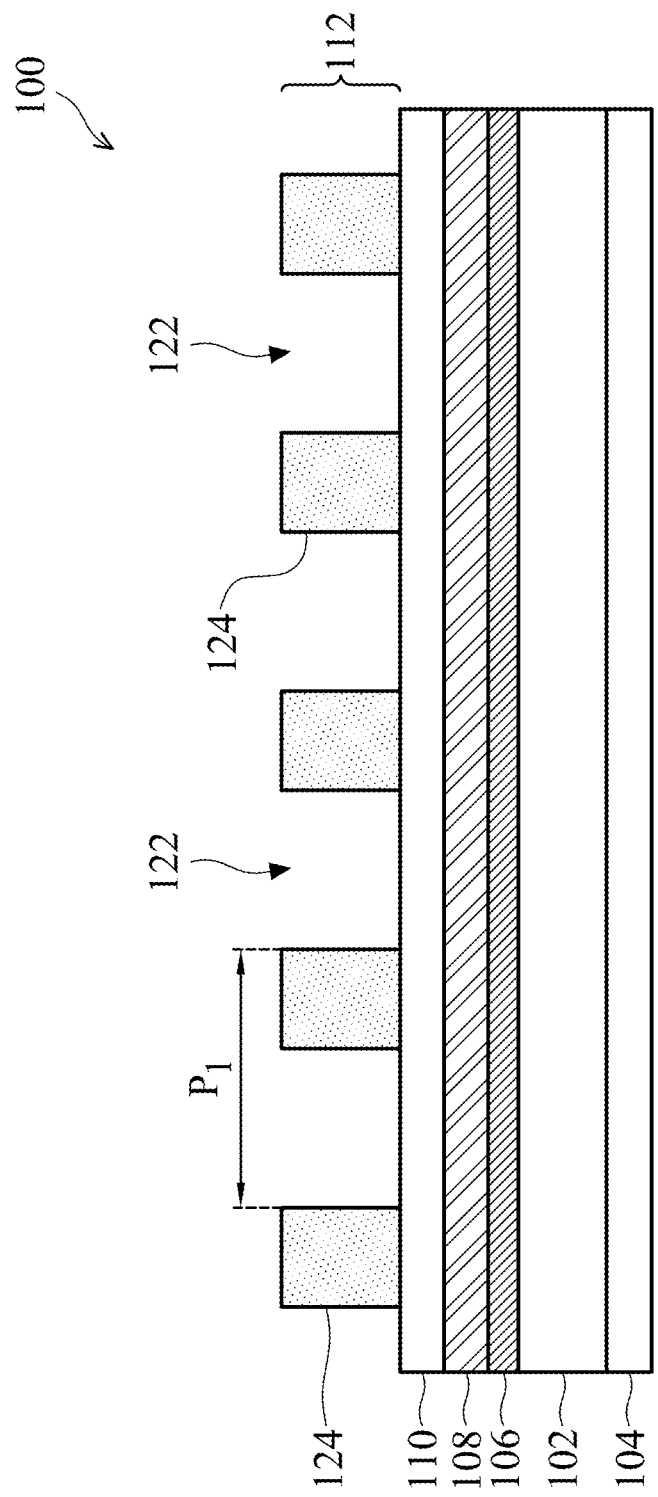

In FIG. 4, the pattern of the bottom layer 114 (see FIG. 3) is transferred to the mandrel layer 112 using an etching process. The etching process of the mandrel layer 112 is anisotropic, so that the openings 122 in the bottom layer 114 are extended through the mandrel layer 112 and have about the same sizes in the mandrel layer 112 as they do in the bottom layer 114. Thus, mandrels 124 are defined from remaining portions of the mandrel layer 112 (e.g., portions of mandrel layer 112 between openings 122). The mandrels 124 have a pitch $P_1$ (see also FIG. 1). In some embodiments, pitch $P_1$ is a minimum pitch achievable using photolithographic processes. During etching the mandrel layer 112, the middle layer 116 is consumed, and bottom layer 114 may be at least partially consumed. In embodiments when the bottom layer 114 is not completely consumed while etching the mandrel layer 112, an ashing process may be performed to remove remaining residue of the bottom layer 114.

Figure 5:
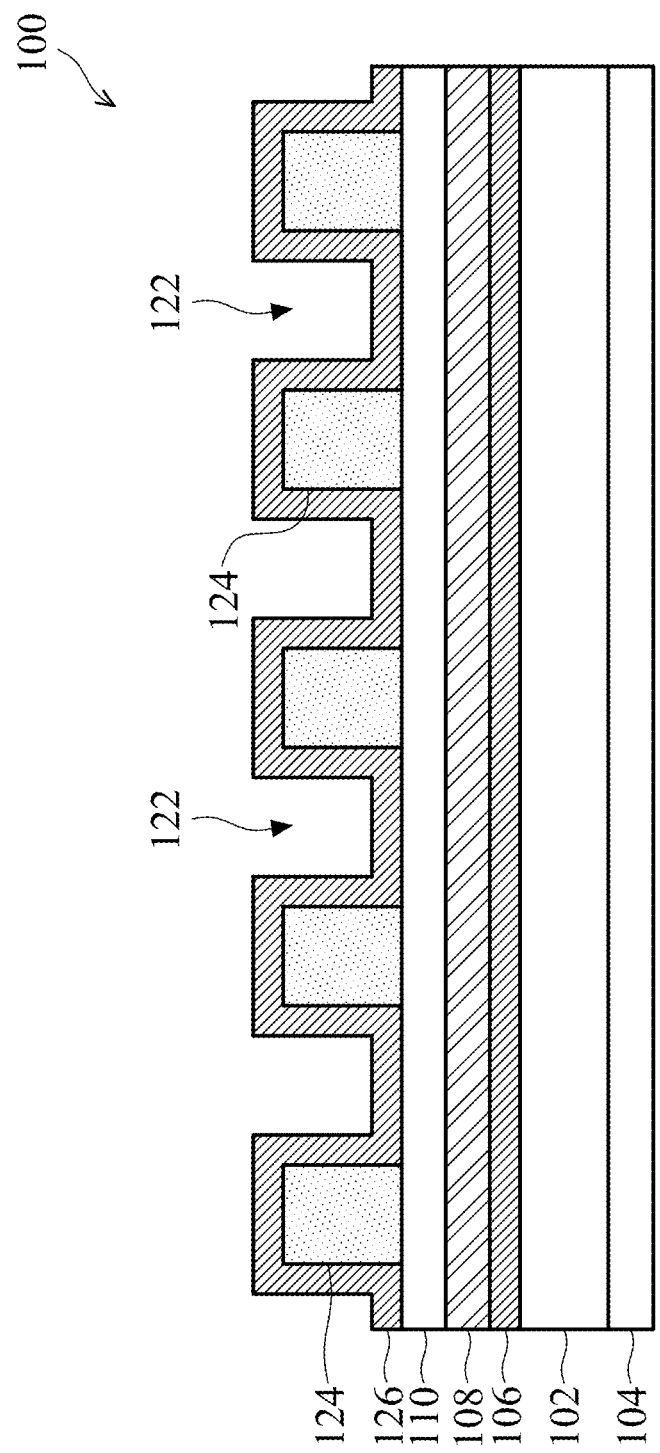

In FIG. 5, a spacer layer 126 is formed over and along sidewalls of the mandrels 124. The spacer layer 126 may further extend along top surfaces of dielectric layer 110 in the openings 122. The material of the spacer layer 126 is selected to have a high etching selectivity with the dielectric layer 110 and mandrels 124. For example, the spacer layer 126 may be comprise AlO, MN, AlON, TaN, TiN, TiO, Si, SiO, SiN, metals, metal alloys, and the like, and may be deposited using any suitable process such as ALD, CVD, or the like. In some embodiments, the deposition process of the spacer layer 126 is conformal so that a thickness of the spacer layer 126 on sidewalls of the mandrels 124 is substantially equal (e.g., within manufacturing tolerances) of a thickness of the spacer layer 126 on the top surface of mandrels 124 and bottom surfaces of the openings 122. In various embodiments, areas of the openings 122 between sidewalls of the spacer layer 126 define line patterns. The line patterns may correspond with desired locations of patterned features (e.g., conductive lines 142/144) subsequently formed in the target layer 102 (see e.g., FIGS. 17A and 17B).

In FIGS. 6A, 6B, 7A, 7B, 8A, 8B, 9A, 9B, 10A, 10B, 11A, 11B, 12A, 12B, 13A, and 13B, a patterned sacrificial material (e.g., sacrificial material 138 see FIGS. 11A and 11B) is formed over selected portions of the spacer layer 126. In particular, the patterned sacrificial material is deposited in select areas of the line patterns (areas of openings 122 between sidewalls of the spacer layer 126, see FIG. 5). The patterned sacrificial material may be used to further define a desired pattern for etching the target layer 102. For example, the patterned sacrificial material may be deposited to define areas where patterned features (e.g., conductive lines) are not formed (e.g., cut) in the target layer 102 (see e.g., FIGS. 17A and 17B). Throughout FIGS. 6A, 6B, 7A, 7B, 8A, 8B, 9A, 9B, 10A, 10B, 11A, 11B, 12A, 12B, 13A, and 13B, figures ending with designation "A" illustrate a same cross-sectional view as FIGS. 1 through 5 while figures ending with the designation "B" illustrate a cross-sectional view taken along line B-B of a respective FIGS. 6A, 7A, 8 A, 9A, 10A, 11A, 12A, and 13A. For example, FIG. 6B illustrates a cross-sectional view taken along line B-B of FIG. 6A; FIG. 7B illustrates a cross-sectional view taken along line B-B of FIG. 7A; and so forth.

Figure 6A:
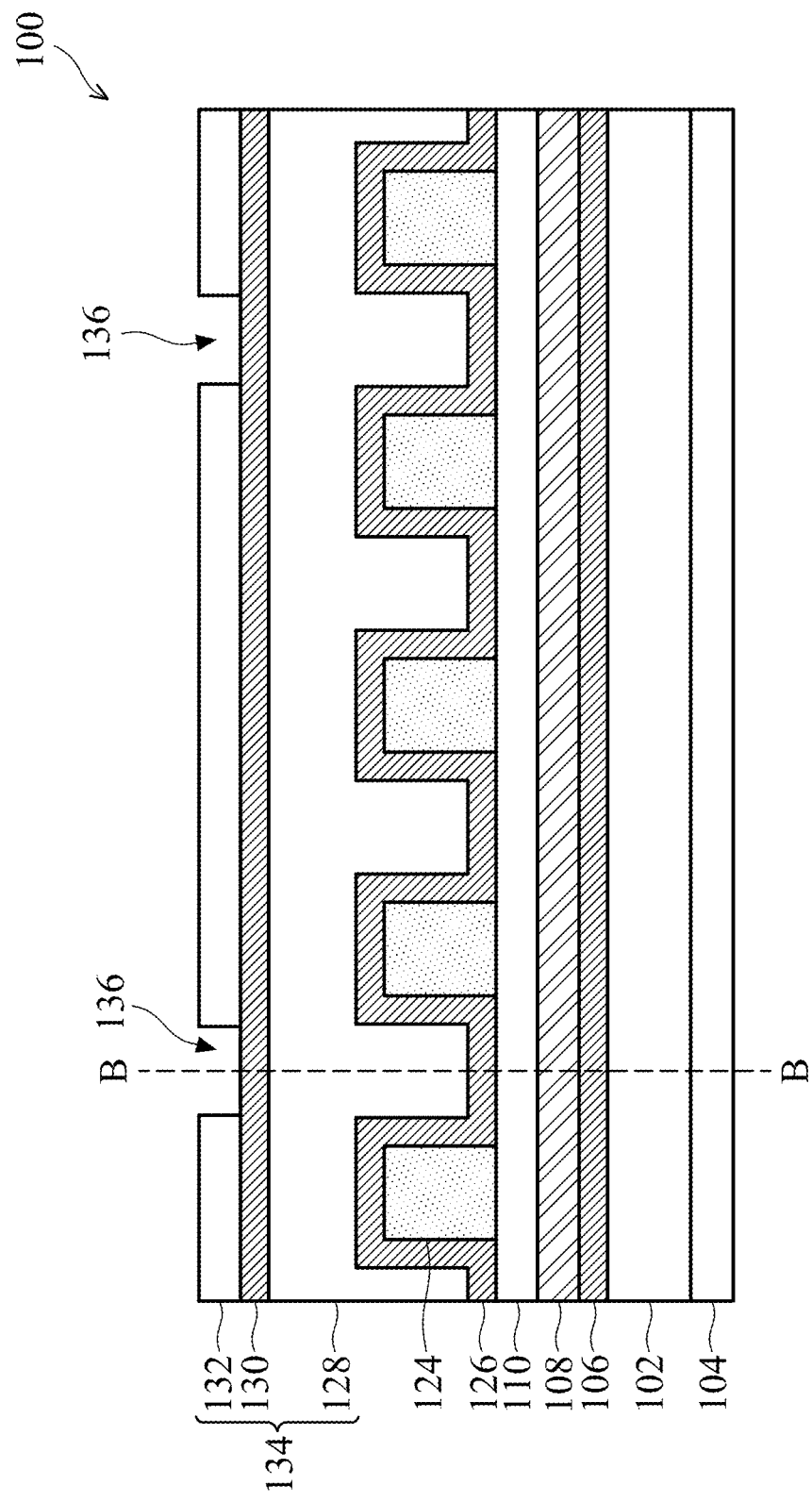
Figure 6B:
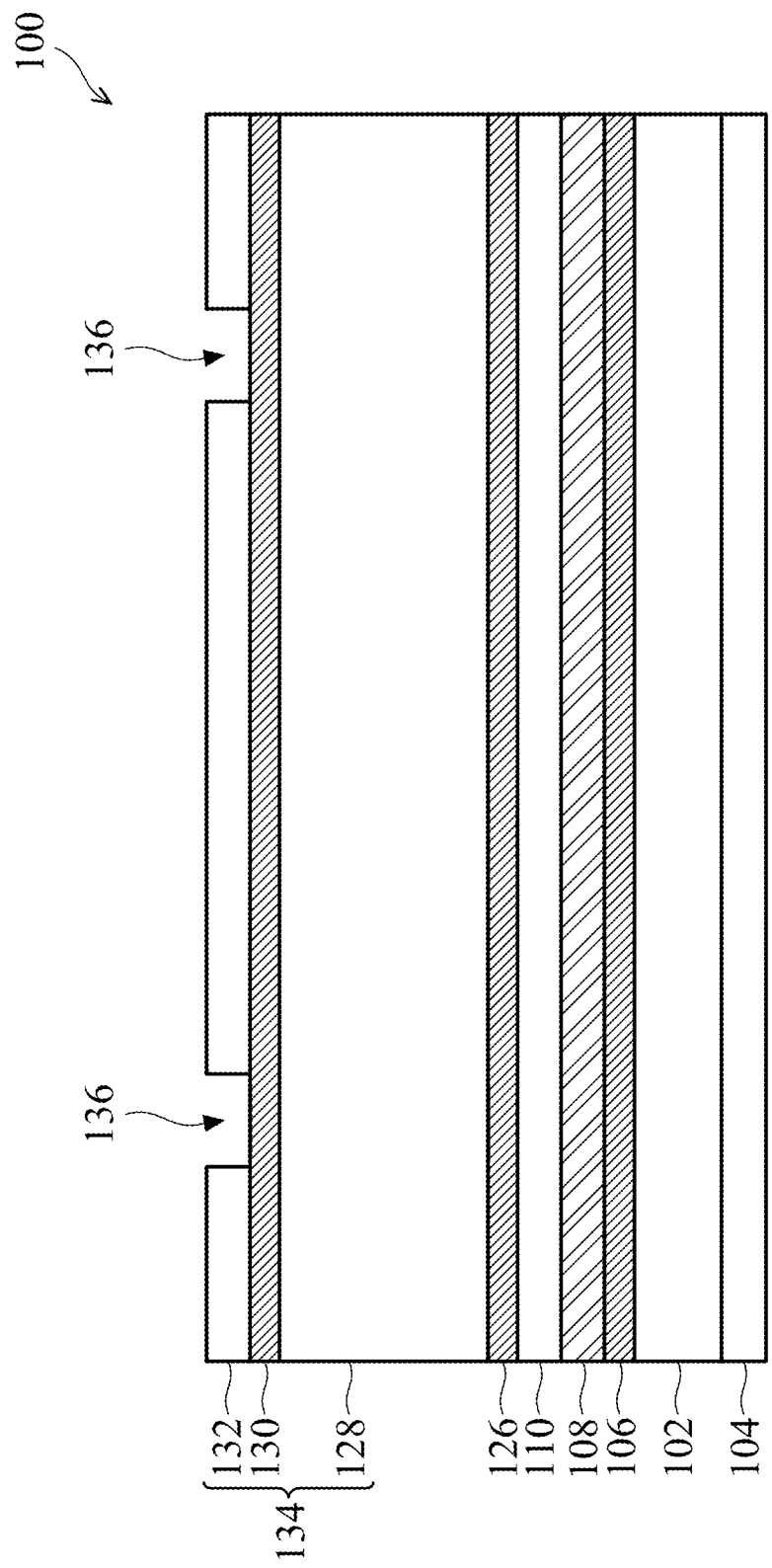

Referring first to FIGS. 6A and 6B, a tri-layer photoresist 134 is formed over the spacer layer 126. The tri-layer photoresist 134 may be deposited between mandrels 124, such as between sidewalls of the spacer layer 126 in the line patterns. The tri-layer photoresist 134 includes a bottom layer 128, a middle layer 130 over the bottom layer 128, and an upper layer 132 over the middle layer 130. The bottom layer 128 and upper layer 132 may be formed of photoresists (e.g., photosensitive materials), which include organic materials. In some embodiments, the bottom layer 128 may also be a BARC layer. The middle layer 130 may comprise an inorganic material, which may be a nitride (such as silicon nitride), an oxynitride (such as silicon oxynitride), an oxide (such as silicon oxide), or the like. The middle layer 130 has a high etching selectivity relative to the upper layer 132 and the bottom layer 128. The various layers of the tri-layer photoresist 134 may be blanket deposited sequentially using, for example, spin-on processes.

In some embodiments, the upper layer 132 is patterned using a photolithographic process and is subsequently used as an etching mask for patterning of the middle layer 130 (see FIGS. 7A and 7B). The middle layer 130 is then used as an etching mask for patterning of the bottom layer 128 (see FIGS. 7A and 7B). The upper layer 132 is patterned using any suitable photolithography process to form openings 136 therein. As an example of patterning openings 136 in the upper layer 132, a photomask (not shown) may be disposed over the upper layer 132. The upper layer 132 may then be exposed to a radiation beam including an ultraviolet (UV) or an excimer laser such as a 248 nm beam from a KrF excimer laser, a 193 nm beam from an ArF excimer laser, or a 157 nm beam from a $F_2$ excimer laser, or the like while the photomask masks areas of the upper layer 132. Exposure of the top photoresist layer may be performed using an immersion lithography system to increase resolution and decrease the minimum achievable pitch. A bake or cure operation may be performed to harden the upper layer 132, and a developer may be used to remove either the exposed or unexposed portions of the upper layer 132 depending on whether a positive or negative resist is used. The pattern of the openings 136 may correspond to a desired pattern of a subsequently formed sacrificial material. For example, the tri-layer photoresist 134 may be used to define a shape of the subsequently formed sacrificial material (e.g., sacrificial material 138, see FIGS. 9A and 9B).

After the patterning of the upper layer 132, the pattern of the upper layer 132 is transferred to the middle layer 130 in an etching process. The etching process is anisotropic, so that the openings 136 in the upper layer 132 are extended through the middle layer 130 and have about the same sizes in the middle layer 130 as they do in the upper layer 132. The resulting structure is illustrated in FIGS. 7A and 7B.

Figure 7A:
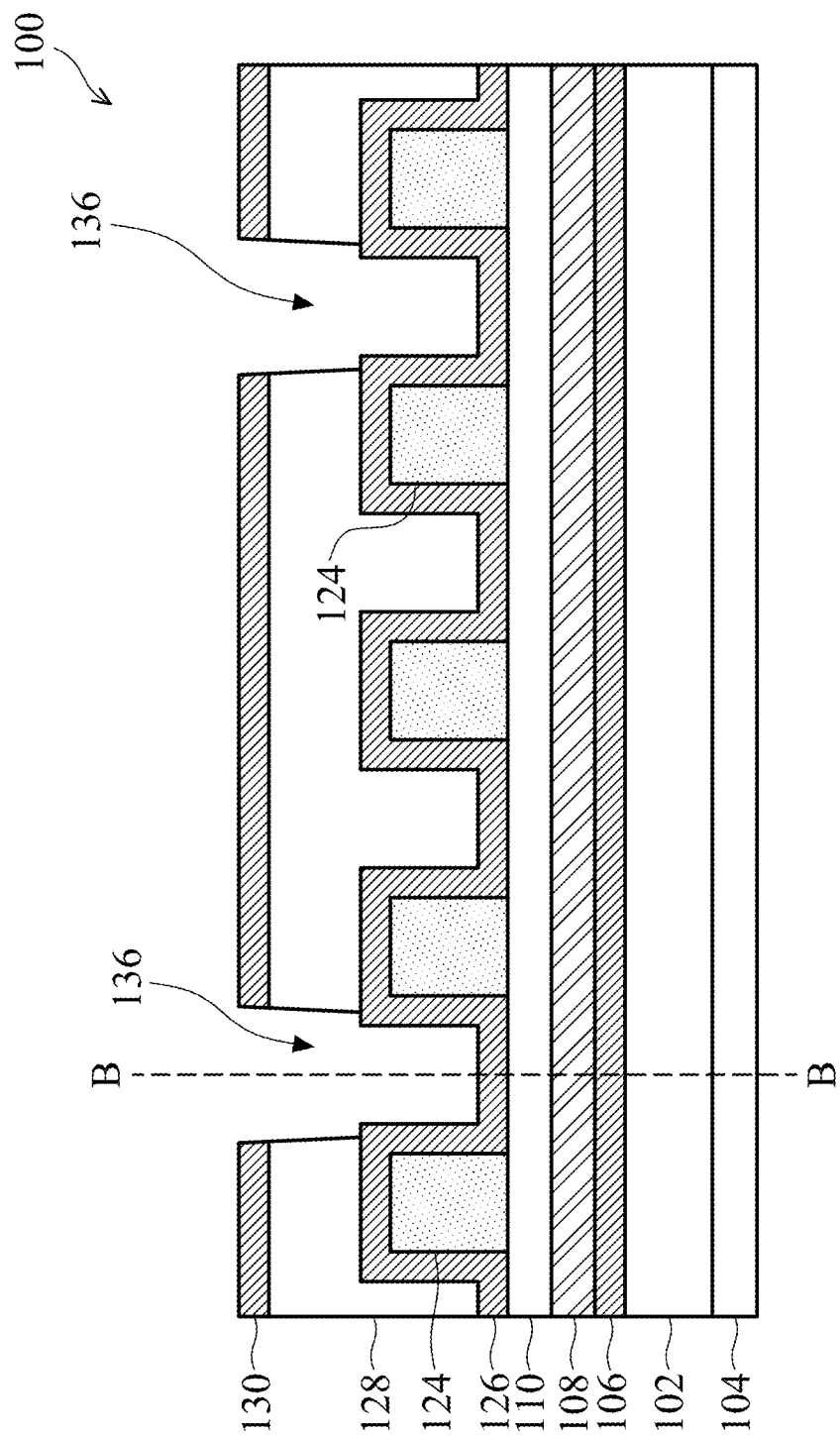
Figure 7B:
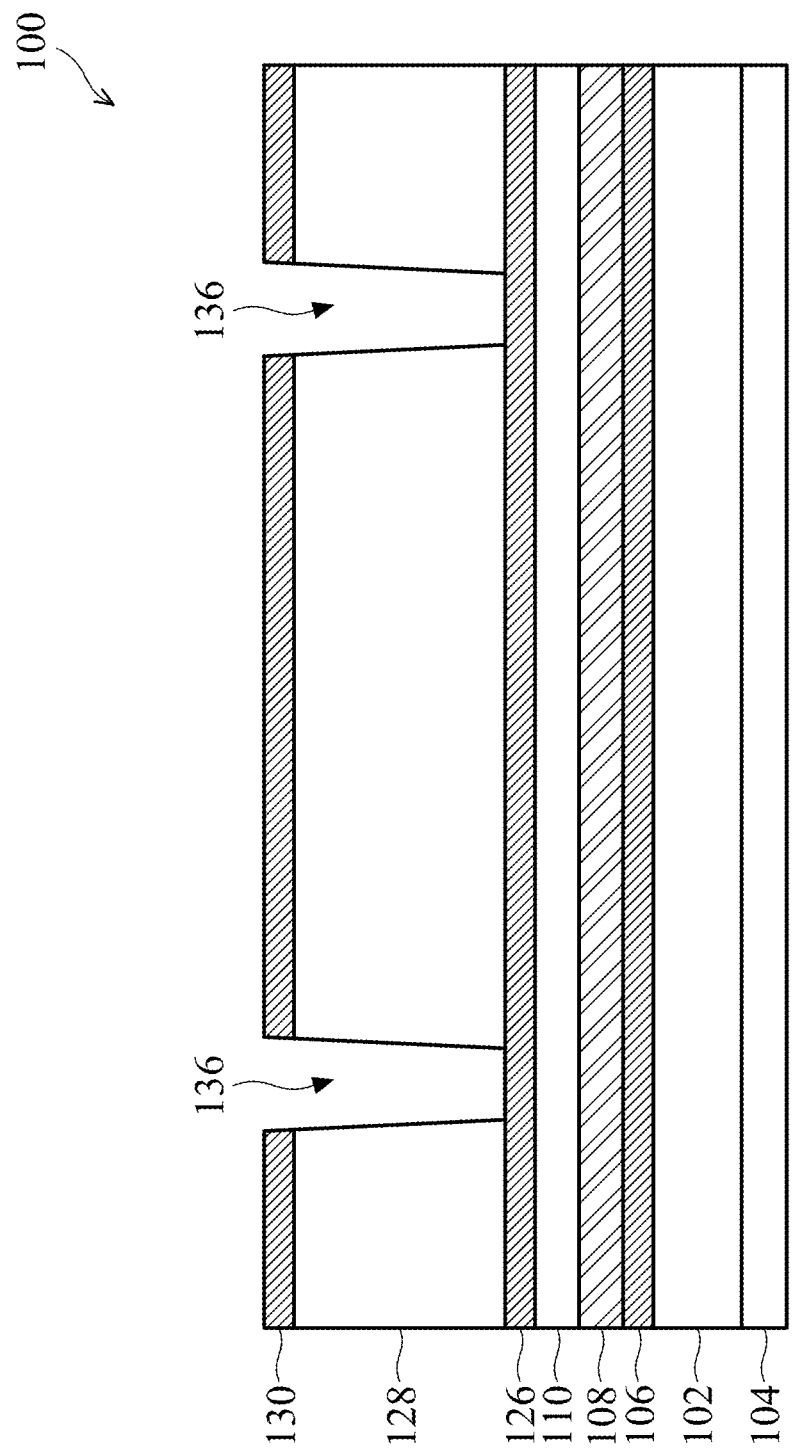

In FIGS. 7A and 7B, after patterning the middle layer 130, an etching process is performed to transfer the pattern of the middle layer 130 to the bottom layer 128, thereby extending the openings 136 through the bottom layer 128. As part of etching the bottom layer 128, the upper layer 132 (see FIGS. 6A and 6B) may be consumed.

Figure 8A:
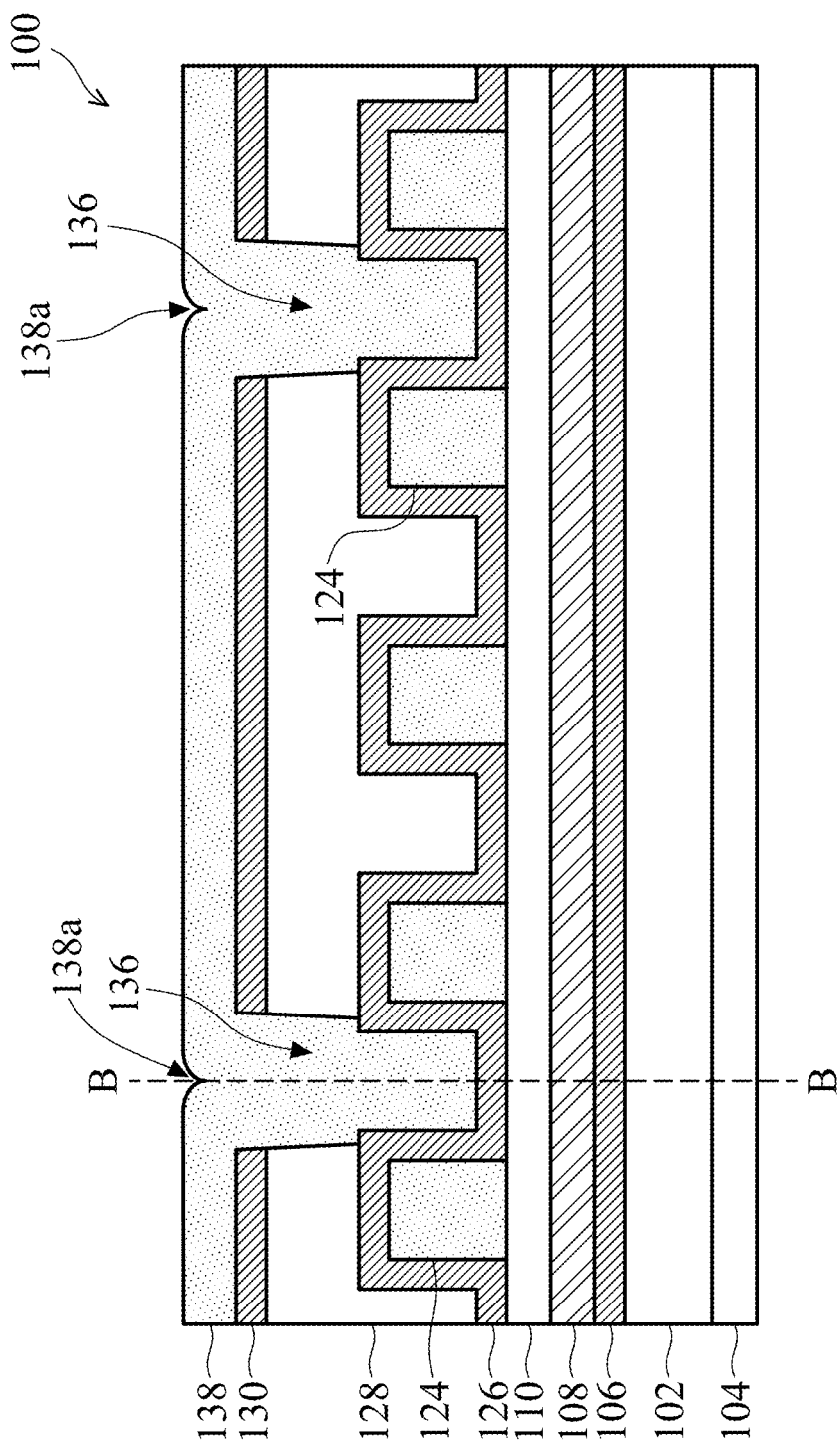
Figure 8B:
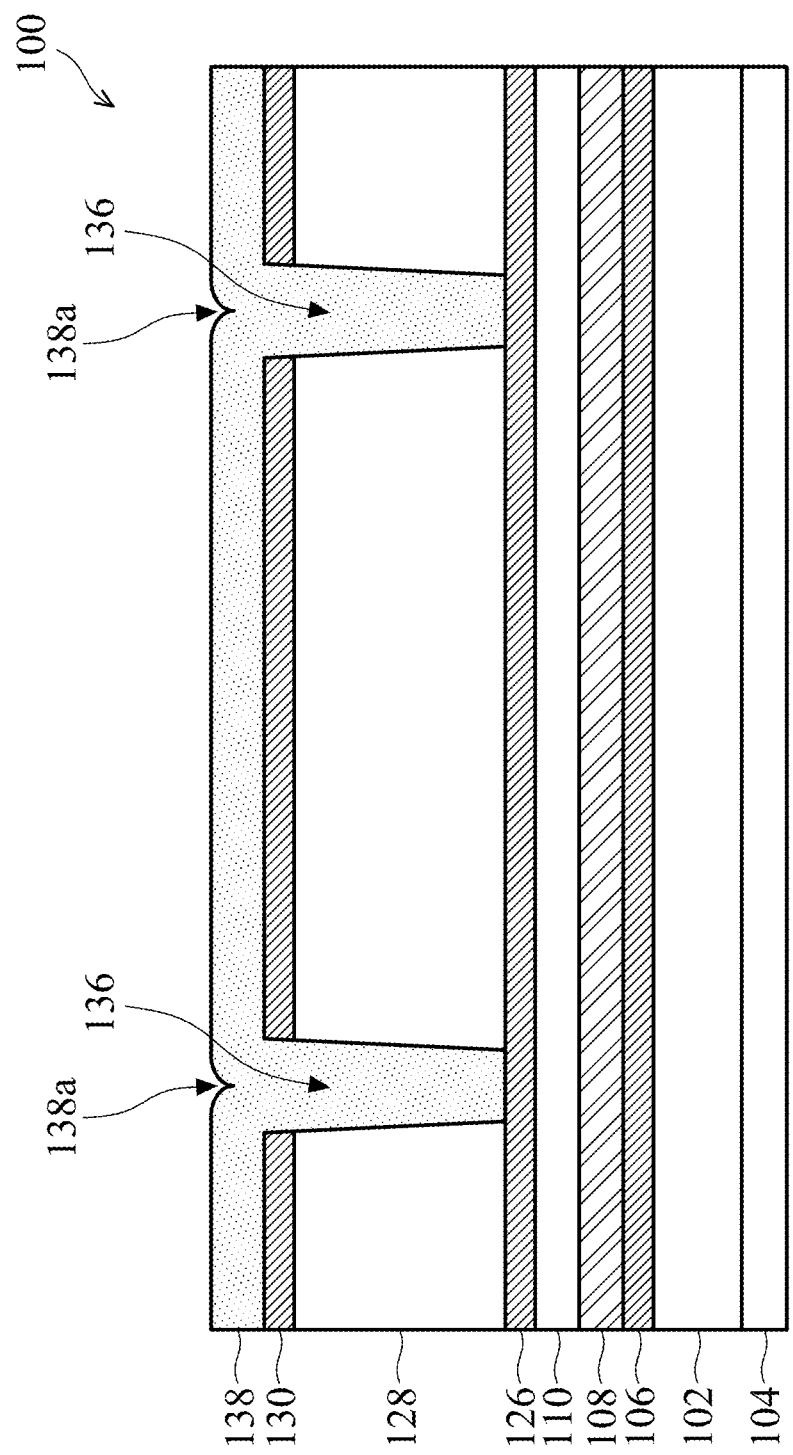

In FIGS. 8A and 8B, a sacrificial material 138 (sometimes also referred to as a reverse material) is deposited over the bottom layer 128 and into the openings 136. In some embodiments, the sacrificial material 138 is also deposited over the middle layer 130. In other embodiments (not illustrated), the middle layer 130 is removed prior to depositing the sacrificial material 138. Removing the middle layer 130 may include a suitable dry etch process or a combination of dry and wet etch processes. In such embodiments, the sacrificial material 138 may be formed directly on (e.g., in direct contact with) a topmost surface of the bottom layer 128.

In various embodiments, the sacrificial material 138 comprises an inorganic material. For example, the sacrificial material 138 may be an inorganic oxide, such as, titanium oxide, tantalum oxide, silicon oxide, and the like. In some embodiments, the inorganic material is a low temperature oxide (LTO). As used herein, the term "LTO" refers to an oxide deposited using a relatively low process temperature (e.g., 200° C. or less). It has been observed that in such embodiments, the low temperature deposition process does not cause significant damage to the bottom layer 128. The sacrificial material 138 may be selected to have sufficient etch selectivity to the spacer layer 126 relative a same etch process. For example, a ratio of an etch rate of the sacrificial material 138 to an etch rate of the spacer layer 126 relative a same etch process is at least 0.7 in some embodiments. It has been observed that when the ratio of the etch rate of the sacrificial material 138 to the etch rate of the spacer layer 126 relative a same etch process is within the above range, increased reliability in the patterning process can be achieved.

The sacrificial material 138 may be formed using a semiconductor film deposition process, such as, CVD, PVD, ALD, or the like. The semiconductor film deposition process may be a conformal process, which forms on sidewalls and a bottom surface of openings 136. As deposition continues, portions of the sacrificial material 138 on opposing sidewalls of the openings 136 may merge, which fills the openings 136. As a result of the semiconductor film deposition process, a top surface of the sacrificial material 138 may not be planar. For example, divots 138a may be present in the top surface of the sacrificial material 138 in and/or over the openings 136.

Compared to spin-on processes, semiconductor film deposition processes allow for the sacrificial material 138 to be filled in the openings 136 with improved gap filling and fewer defects (e.g., less bubbling in the sacrificial material 138). In embodiments where the middle layer 130 is removed prior to the deposition of the sacrificial material 138, the reduction of defects may be especially prevalent. While not being bound to any particular theory, this further reduction in defects may be the result of the bottom layer 128 providing a better surface (e.g., having fewer kinks) compared to the middle layer 130 for the deposition of the sacrificial material 138.

Figure 9A:
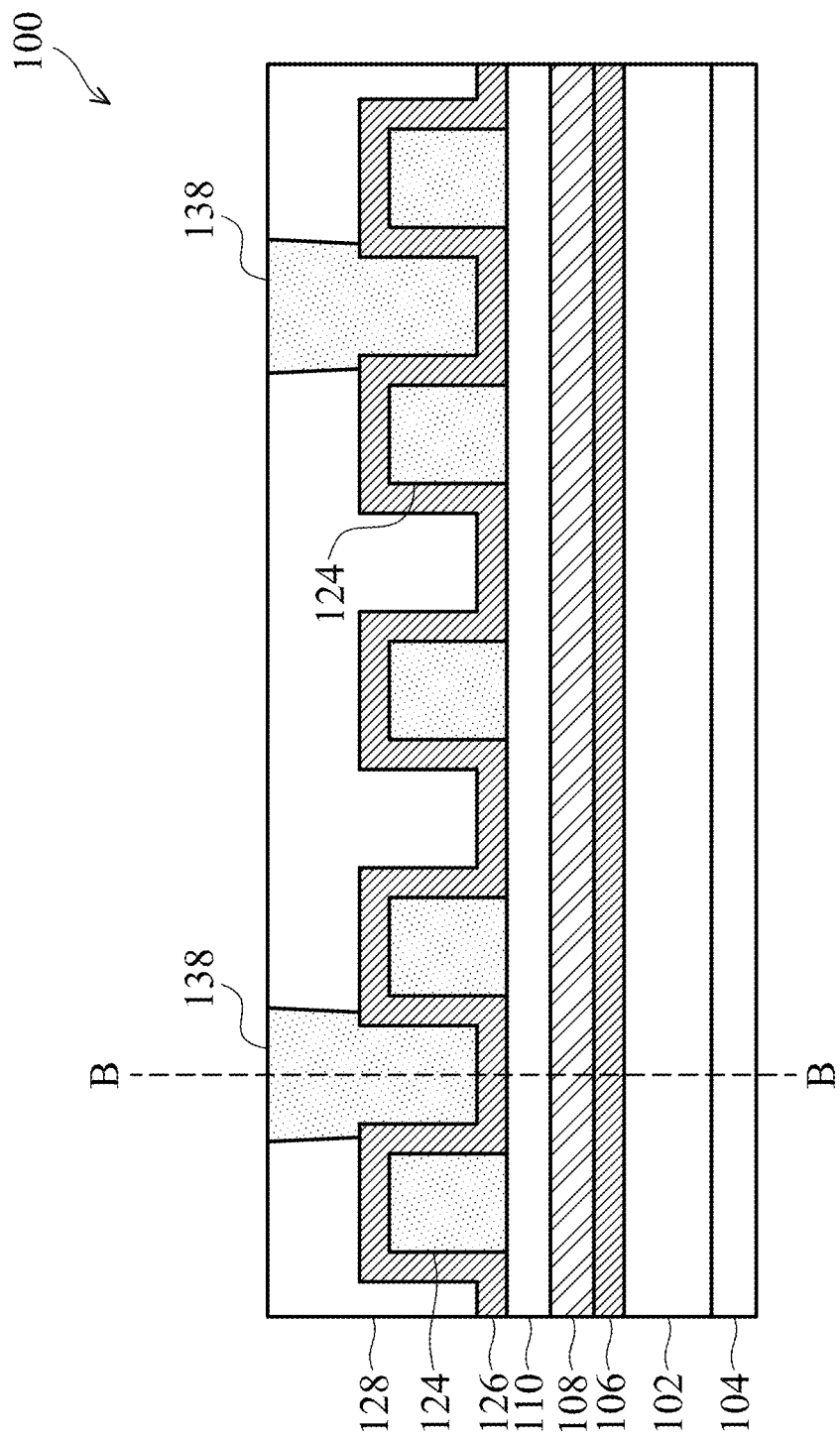
Figure 9B:
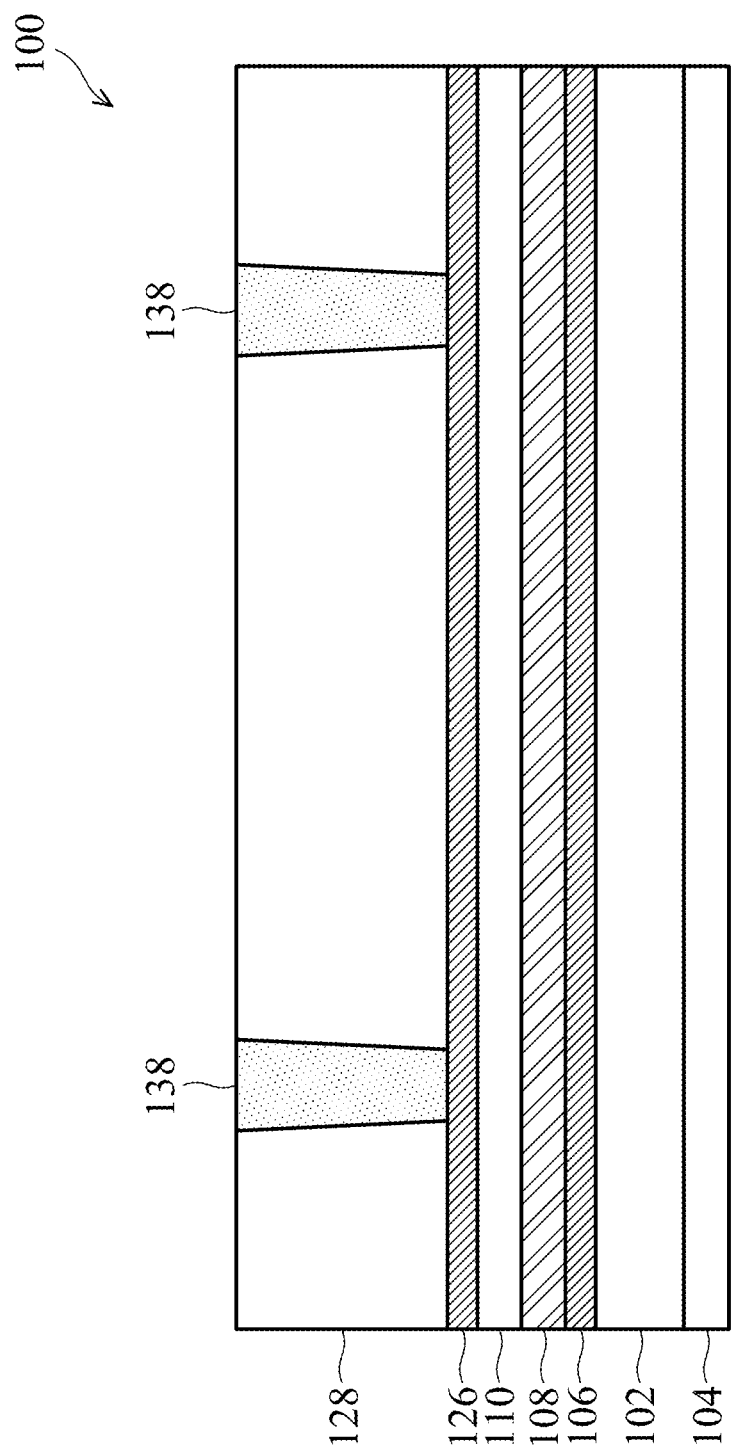

Next, in FIGS. 9A and 9B, a planarization process (e.g., a chemical mechanical polish (CMP), dry etching, combinations thereof, or the like) is performed to remove excess portions of the sacrificial material 138 outside of the openings 136. In embodiments where the sacrificial material 138 is formed over the middle layer 130, the planarization process may also remove the middle layer 130. After the planarization process, the bottom layer 128 is exposed, and top surfaces of the sacrificial material 138 and the bottom layer 128 may be co-planar. In some embodiments, the planarization process may also remove the divots 138a (see FIGS. 8A and 8B) formed in the sacrificial material 138.

Figure 10A:
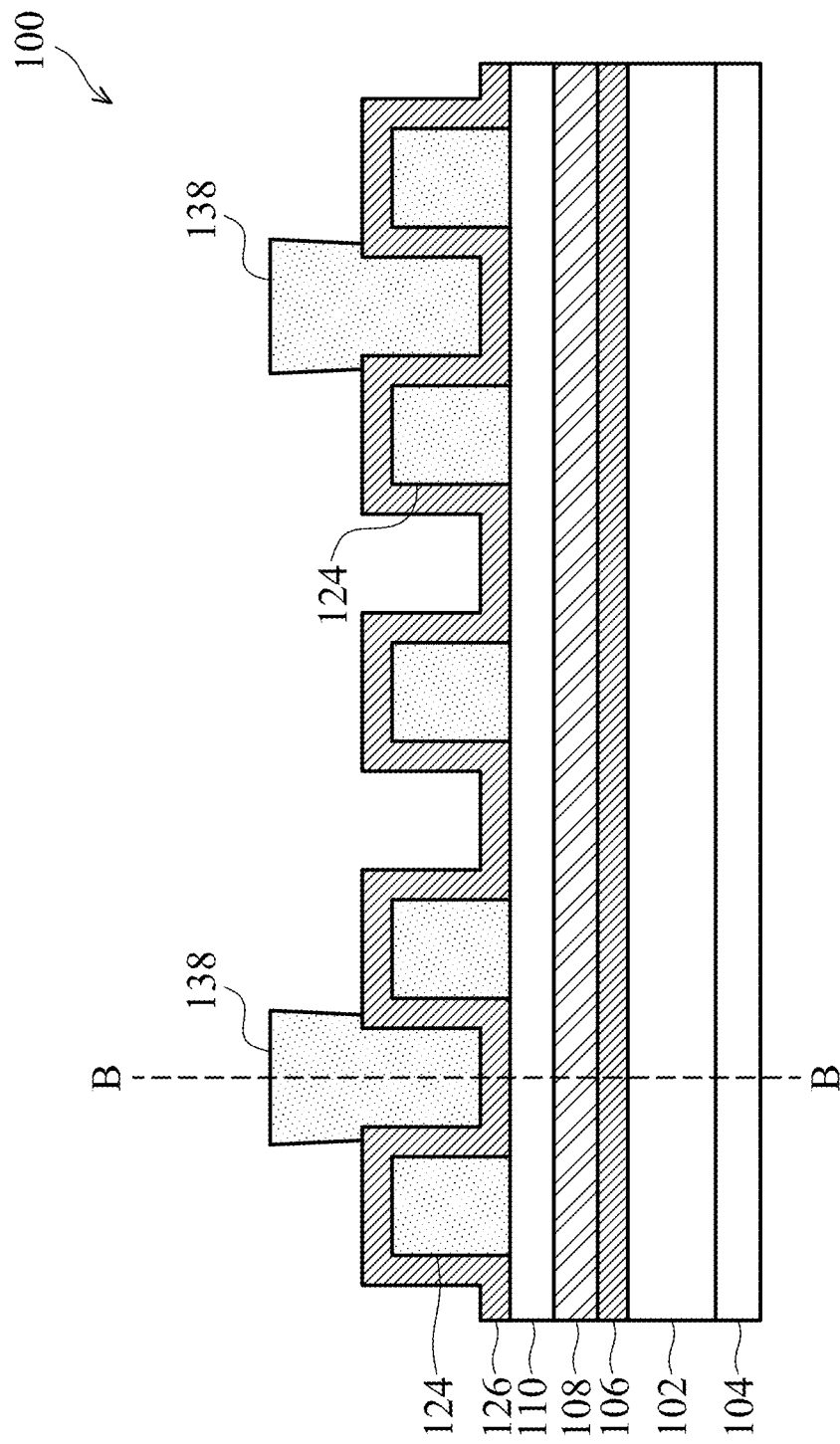
Figure 10B:
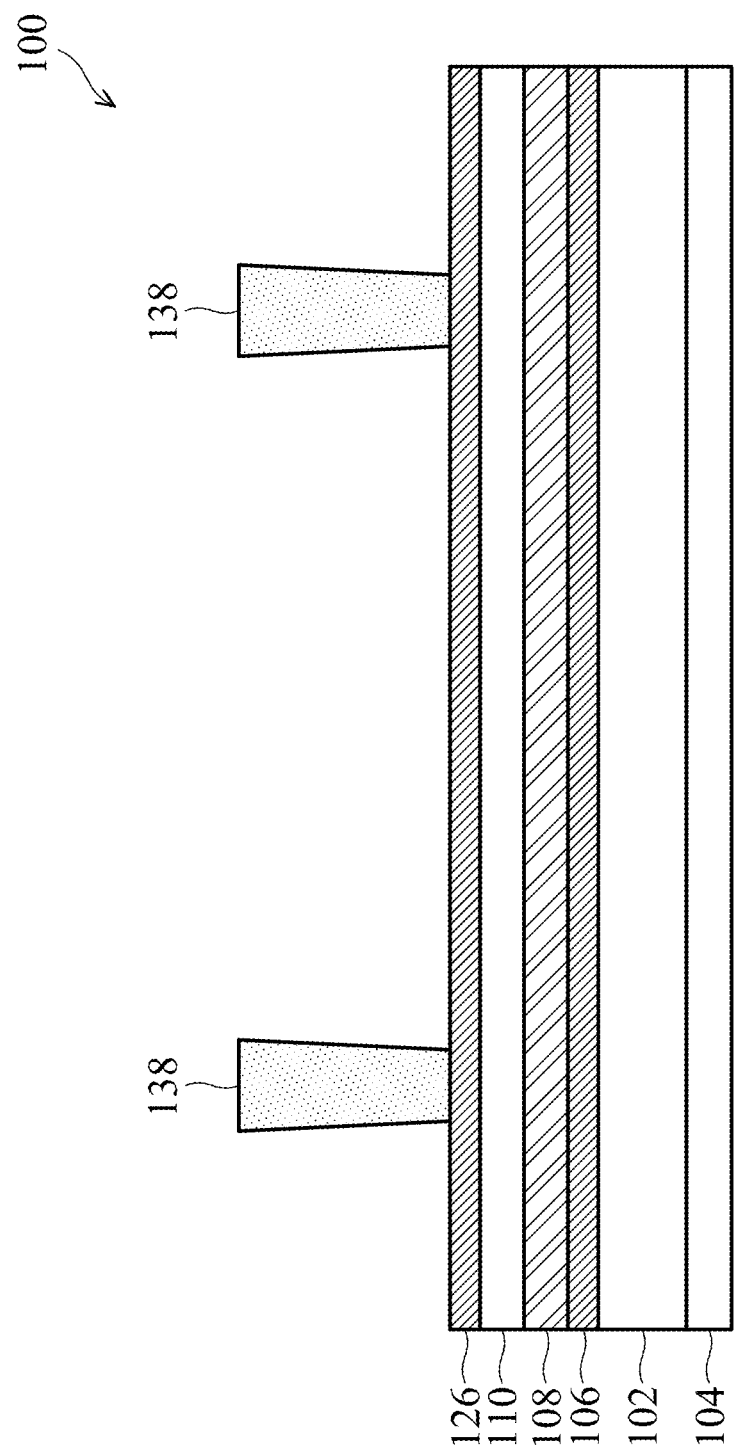

In FIGS. 10A and 10B, the bottom layer 128 is removed using an ashing process. After the bottom layer 128 is removed, pillars of the sacrificial material 138 remain. The remaining sacrificial material 138 mask select areas of the spacer layer 126. In some embodiments, the sacrificial material 138 may span from a first sidewall portion of the spacer layer 126 on a first mandrel 124 to a second sidewall portion of the spacer layer 126 on a second mandrel 124.

Figure 11A:
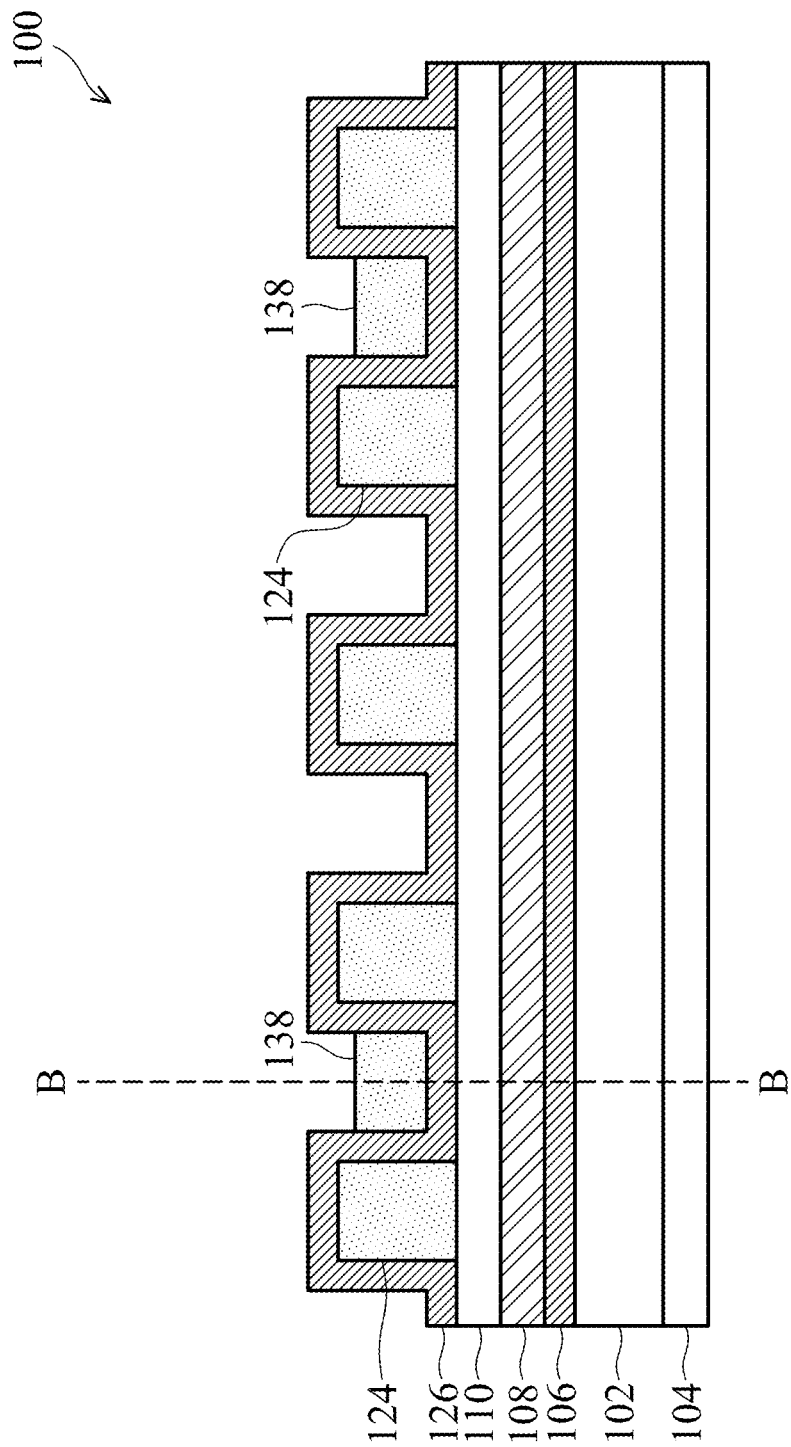
Figure 11B:
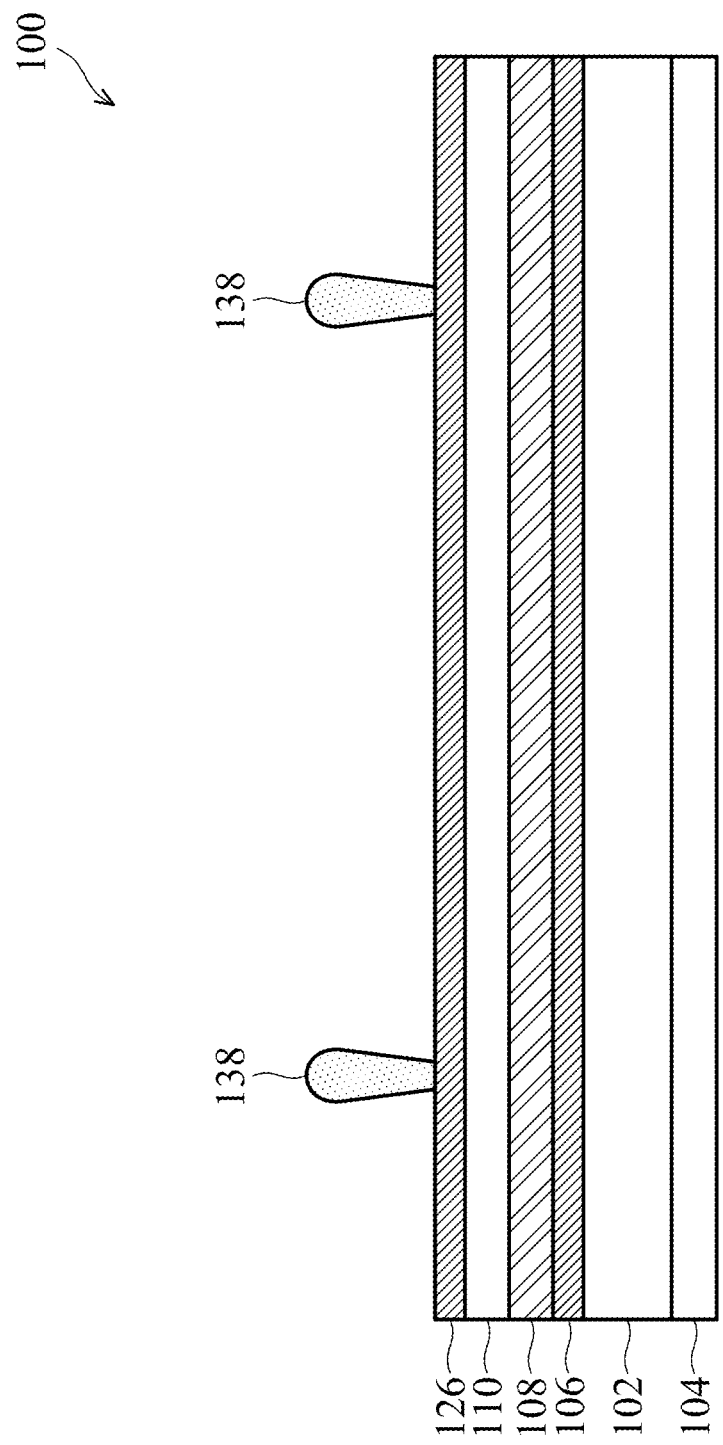

In FIGS. 11A and 11B, the sacrificial material 138 is trimmed in order to achieve a desired profile. In some embodiments, trimming the sacrificial material 138 recesses the sacrificial material 138 below a topmost surface of the spacer layer 126, such as, below a top surface of the mandrels 124. Trimming the sacrificial material 138 may expose portions of the spacer layer 126 over the mandrels 124 (see FIG. 11A). In some embodiments, trimming the sacrificial material 138 further reduces a width of the sacrificial material 138 in at least cross-section B-B (see FIG. 11B).

Trimming the sacrificial material 138 may include a dry etch process or a combination of dry and wet etch processes. Embodiment dry etch processes for trimming the sacrificial material 138 may comprise using carbon-fluro-based etchants (e.g., $CF_4$). Other process gases may be used in combination with the carbon-fluro-based etchants, such as, oxygen ($O_2$), nitrogen ($N_2$), argon (Ar), combinations thereof, or the like. Embodiment wet etch processes for trimming the sacrificial material 138 may comprise using diluted hydrofluoric acid as an etchant. A desired shape of the sacrificial material 138 may be achieved, for example, by controlling the duration of the etch trimming process.

Figure 12A:
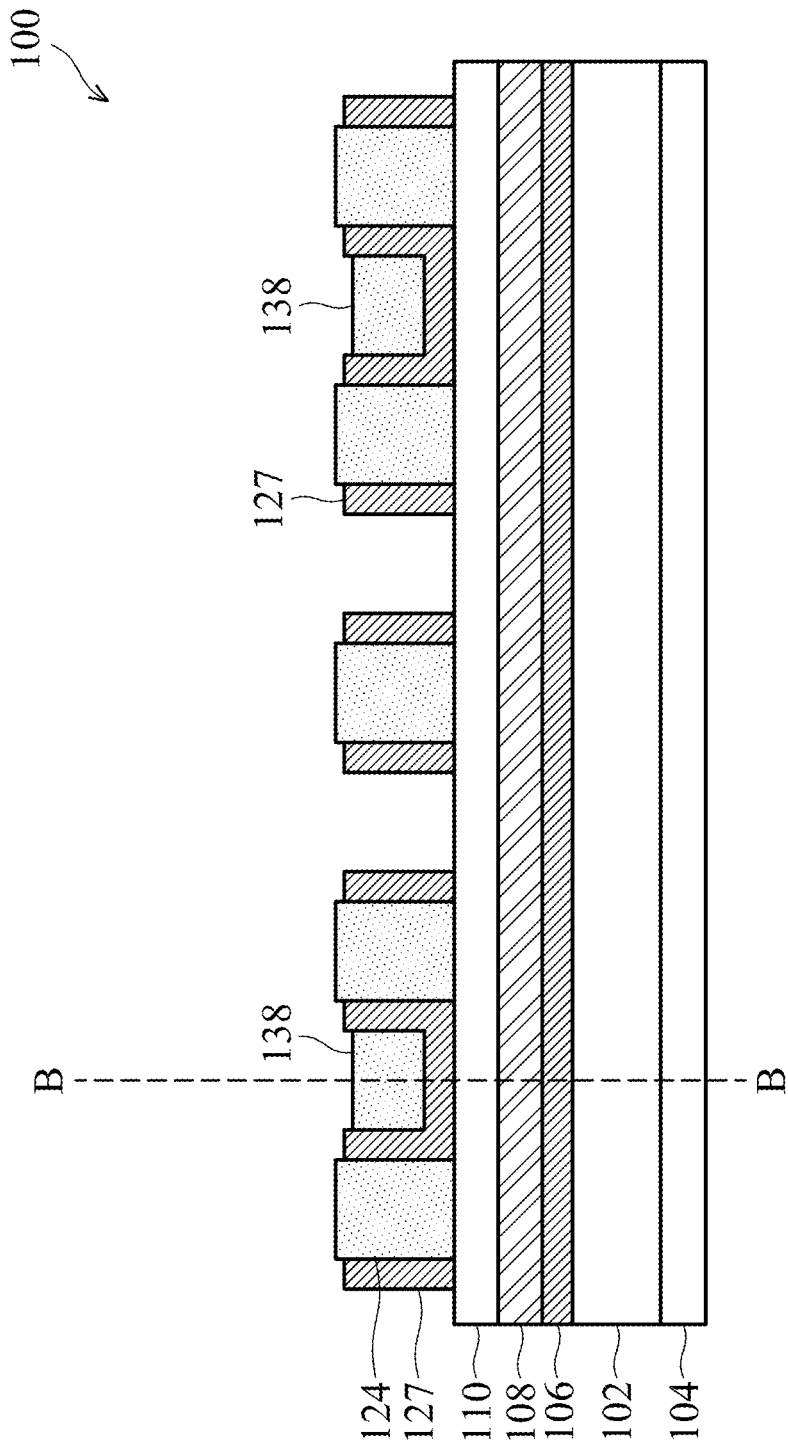
Figure 12B:
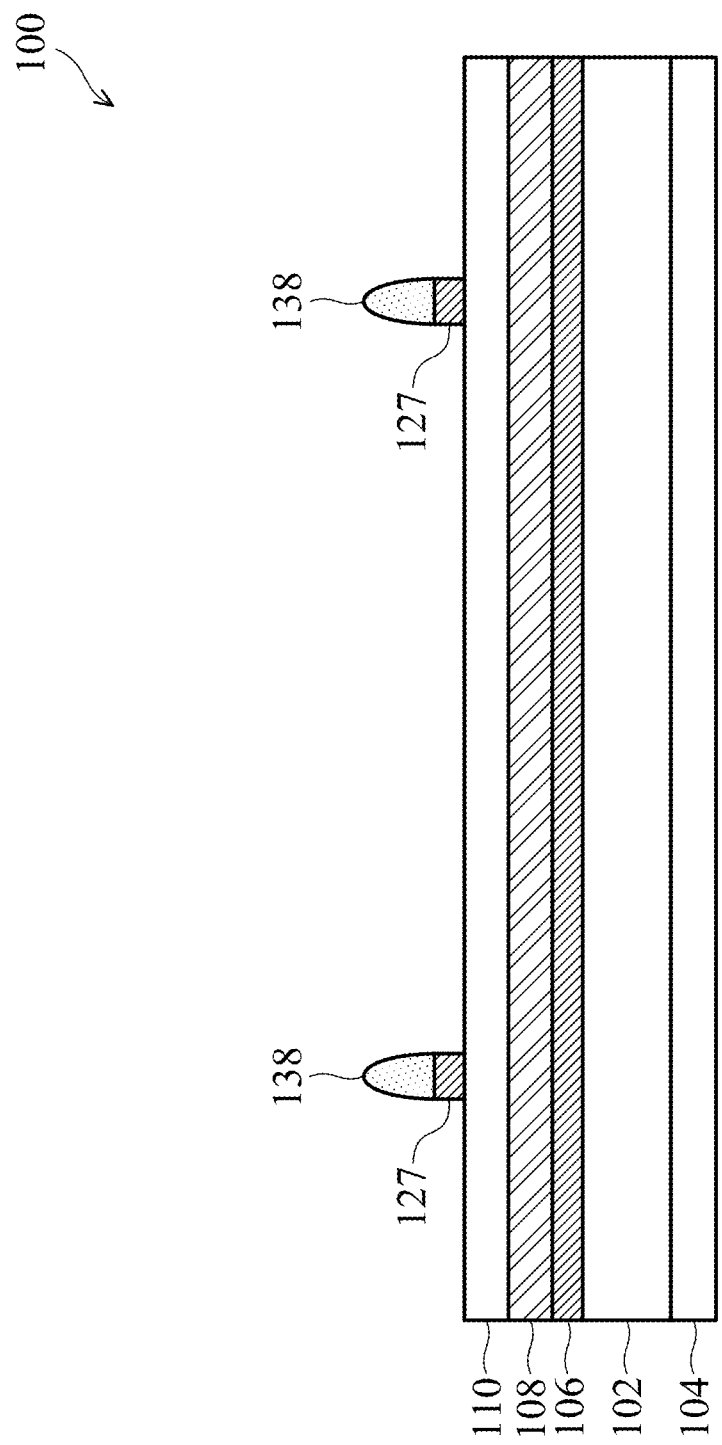

Subsequently, an etching process is performed to remove exposed, horizontal portions of the spacer layer 126 to expose the mandrels 124. The vertical portions of the spacer layer 126 remain after the etching and are referred to as spacers 127 hereinafter. Furthermore, masked portions of the spacer layer 126 (e.g., areas masked by the sacrificial material 138) may also remain after the etching. In some embodiments, etching the spacer layer 126 is a dry etch process using a suitable etchant, such as, $CH_4$, $Cl_2$, combinations thereof, and the like. Other process gases, e.g., nitrogen ($N_2$) may be used as in combination with the etchant during the dry etch process. The dry etch process may anisotropic and etch exposed, lateral portions of the spacer layer 126 without significantly removing vertical portions of the spacer layer 126 (spacers 127) or the sacrificial material 138. The resulting structure is illustrated in FIGS. 12A and 12B.

Figure 13A:
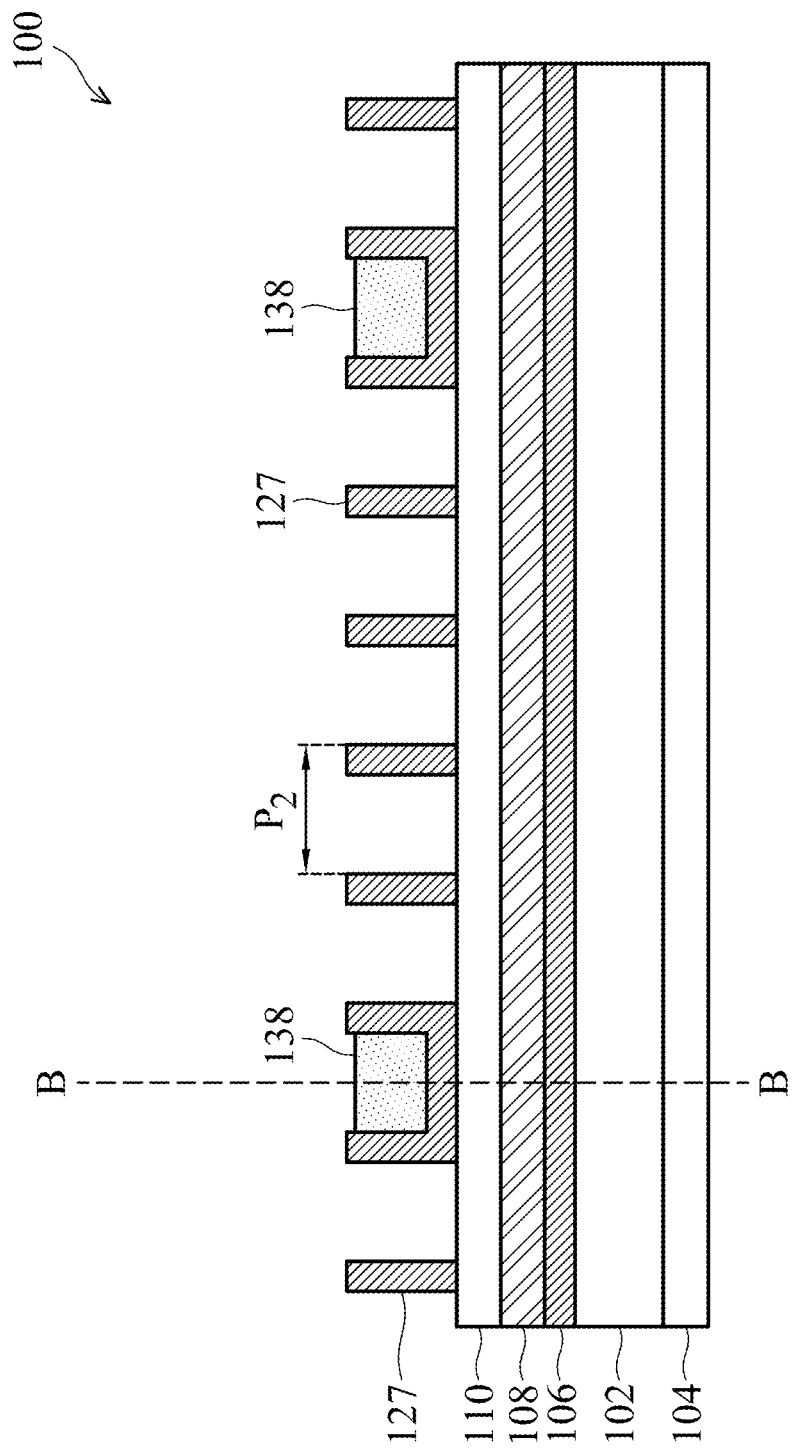
Figure 13B:
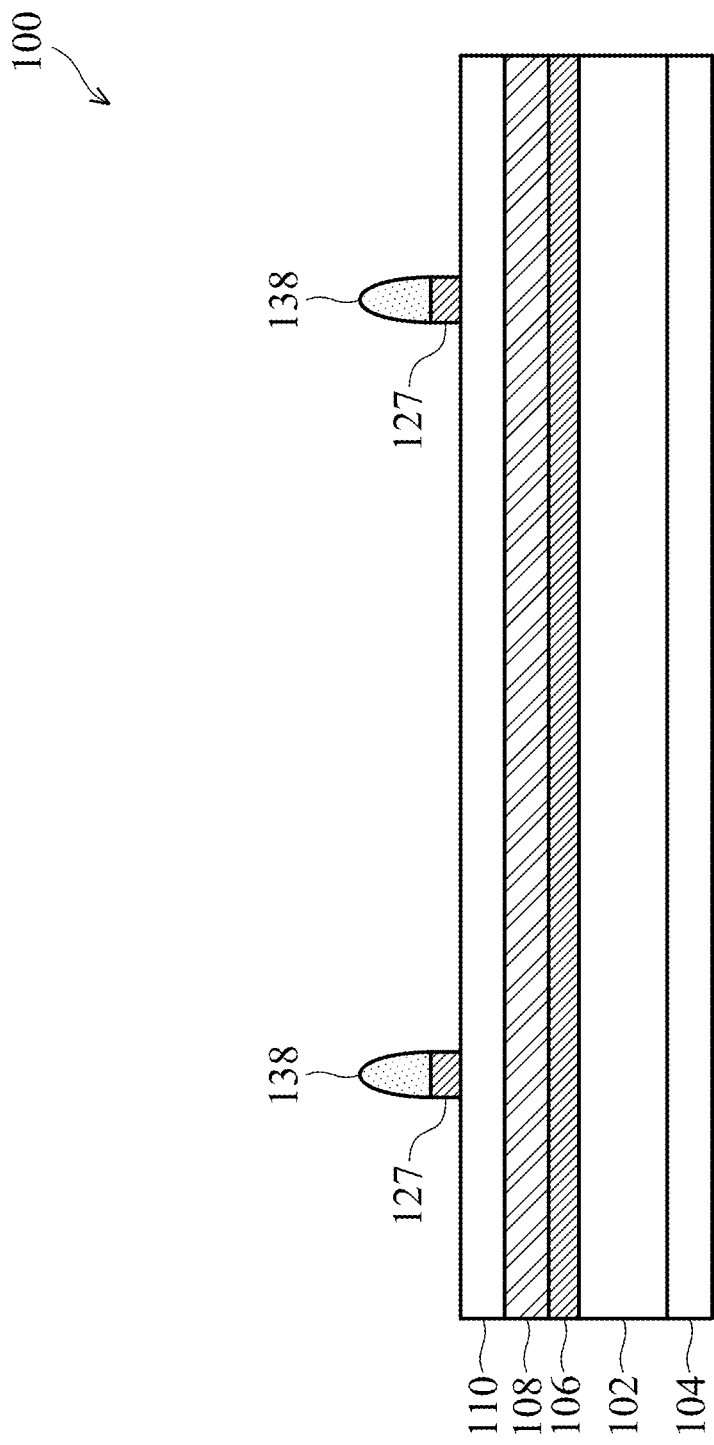

In FIGS. 13A and 13B, the mandrels 124 are removed using an etching process. Because the mandrels 124, the spacer layer 126, and the sacrificial material 138 have etch selectivity relative a same etch process, the mandrels 124 may be removed without removing the spacers 127 or the sacrificial material 138. Etching the mandrels 124 exposes the underlying dielectric layer 110, which may act as an etch stop layer.

Although FIGS. 13A and 13B illustrate all of the mandrels 124 being removed, various embodiments also contemplate the selective removal of the mandrels 124. For example, in certain area (e.g., depending on device layout) of a wafer on which the target layer 102 is formed, mandrels 124 may be not be formed and/or removed. In order to achieve the selective removal of the mandrels 124, a photoresist (not explicitly illustrated) may be deposited over the mandrels 124, the spacers 127, and the sacrificial material 138. The photoresist may be similar to photoresist 120, see FIGS. 1-3, and openings in the photoresist may expose areas where the mandrels 124 are removed while masking other areas of the mandrels 124 from removal. Subsequently, the photoresist may be removed using an ashing step.

Figure 14:
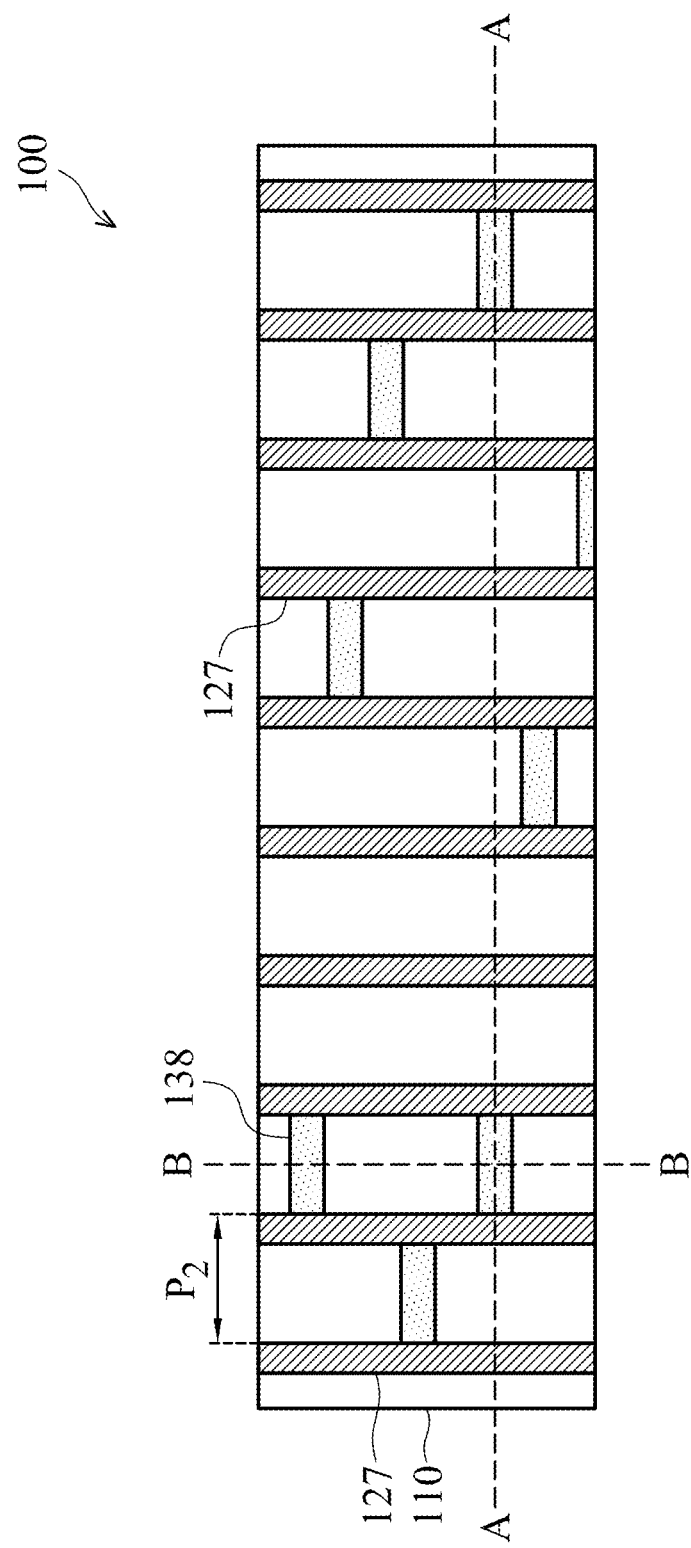

After some or all of the mandrels 124 are removed, the spacers 127 may have a pitch P2. In embodiments where a SADP process as described above is employed, pitch P2 is one half of a minimum pitch achievable by photolithographic processes. The combination of the spacers 127 and the sacrificial material 138 define a pattern for the hard mask layer 108. FIG. 14 illustrates a top-down view of pattern defined by the spacers 127 and the sacrificial material 138. FIG. 13A illustrates a cross-sectional view taken along line A-A of FIG. 14 while FIG. 13B illustrates a cross-sectional view taken along line B-B of FIG. 14. In some embodiments, the pattern defined by the spacers 127 and the sacrificial material 138 is a negative of subsequently formed conductive lines. For example, the space around the pattern defined by the spacers 127 and the sacrificial material 138 corresponds to a pattern of subsequently formed conductive lines. As illustrated by FIG. 14, the sacrificial material 138 spans a space between adjacent ones of the spacers 127, and the sacrificial material 138 defines areas where the negative pattern is cut. For example, the sacrificial material 138 may define areas between subsequently formed conductive lines.

FIGS. 15A, 15B, 16A, 16B, 17A, and 17B illustrate cross sectional views of patterning and depositing features in the target layer 102 based on the pattern defined by the spacers 127 and the sacrificial material 138. In the embodiments of FIGS. 15A, 15B, 16A, 16B, 17A, and 17B, the target layer 102 is a dielectric layer and patterned conductive features are formed in the dielectric layer. Figures ending with the designation "A" refer to a cross-sectional view along line A-A of FIG. 14 while Figures ending with the designation "B" refer to a cross-sectional view along line B-B of FIG. 14.

Figure 15A:
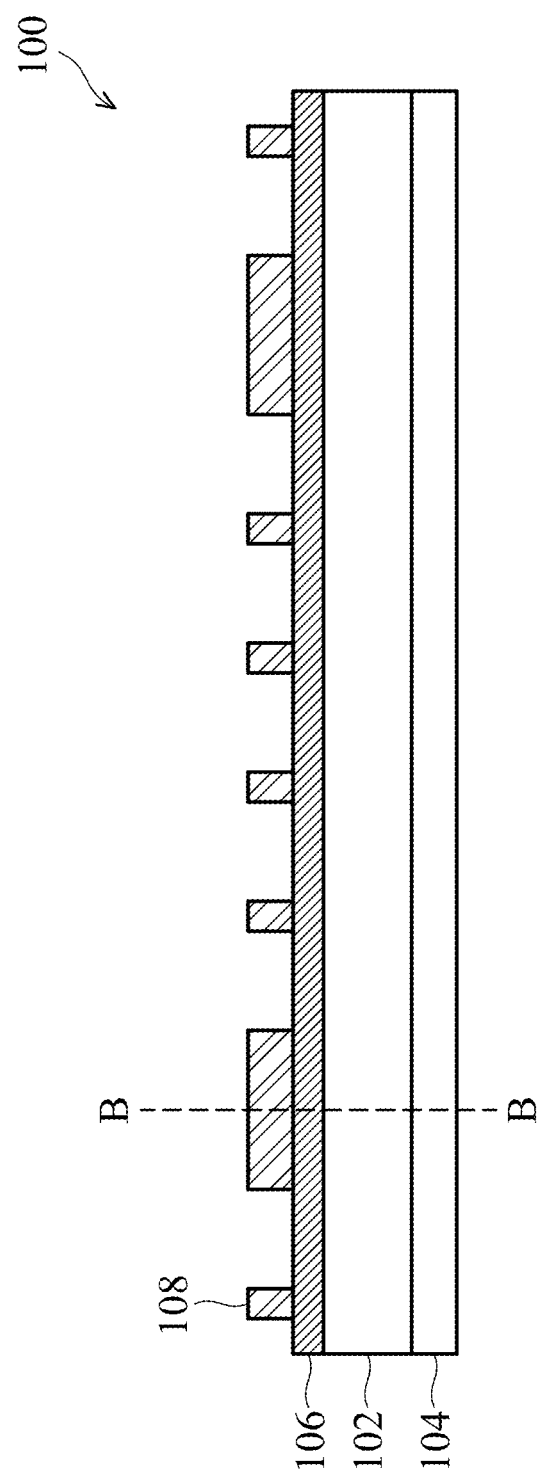
Figure 15B:
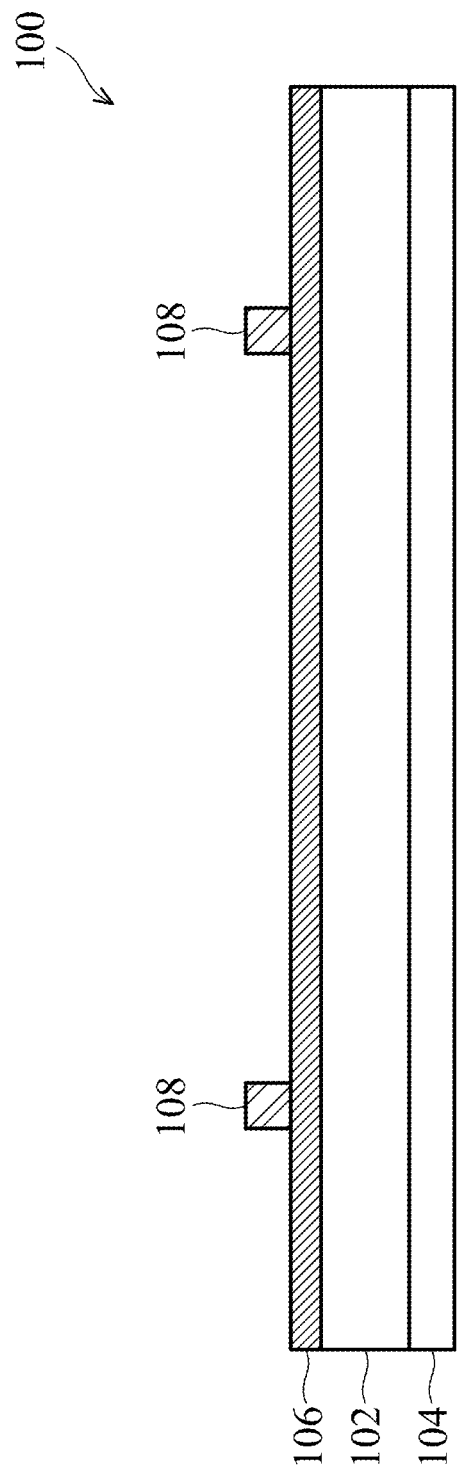

Referring first to FIGS. 15A and 15B, the dielectric layer 110 (see FIGS. 13A and 13B) and the hard mask layer 108 are sequentially etched using the spacers 127 and the sacrificial material 138 as an etching mask. Any unremoved mandrels 124 (not illustrated) may also be used as an etching mask to pattern the hard mask layer 108. Thus, the hard mask 108 may have a same pattern in a top-down view as the spacers 127 and the sacrificial material 138 (e.g., see FIG. 14). In some embodiments, etching the hard mask layer 108 comprises an anisotropic dry etch and/or wet etch. After the hard mask layer 108 is patterned, a wet cleaning may be performed to remove any remaining portions of the spacers 127, the sacrificial material 138, and the dielectric layer 110.

Subsequently, in FIGS. 16A and 16B, the hard mask layer 108 is used as an etching mask to pattern openings 140 in the target layer 102. Etching the target layer 102 may comprise an anisotropic dry etch process and/or a wet etch process, which sequentially etches through the ARC 106 to the target layer 102. Remaining portions of the target layer 102 may have a same pattern as the spacers 127 and the sacrificial material 138 of FIG. 14. After the openings 140 are patterned, a wet cleaning may be performed to remove any remaining portions of the hard mask layer 108 and the ARC 106.

Figure 17A:
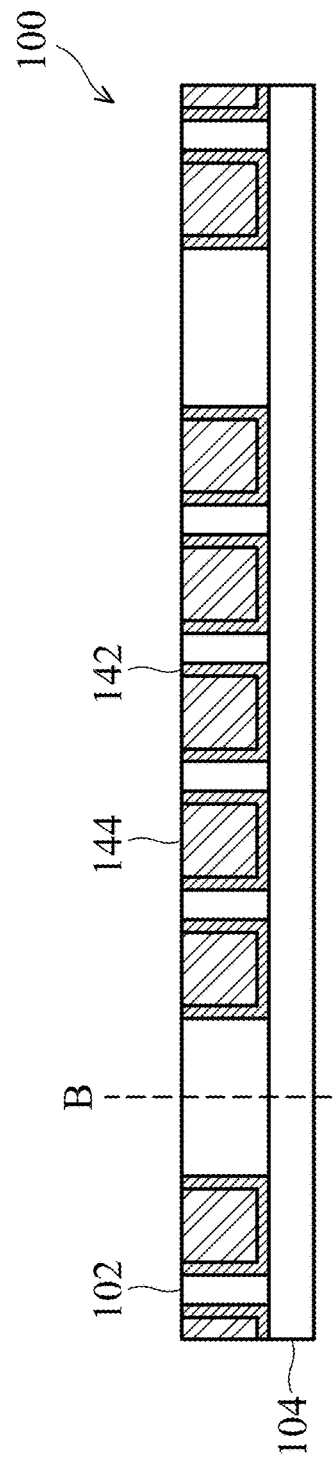
Figure 17B:
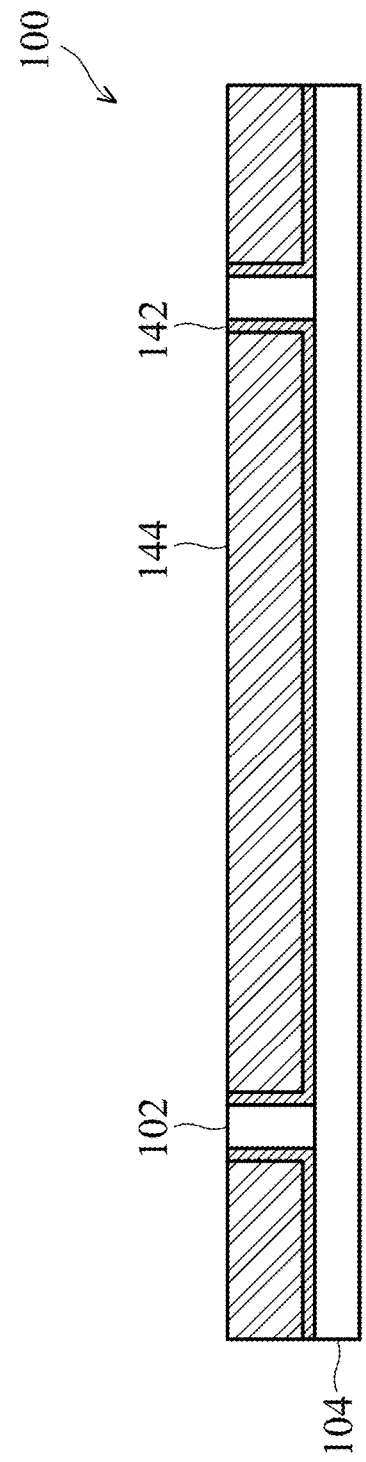

After openings 140 are patterned in the target layer 102, features may be formed in the openings. In an embodiment, the target layer 102 is a low-k dielectric, and the patterned target layer 102 provides an IMD for an interconnect structure. Conductive features such as copper lines, copper vias, and/or cobalt plugs may be formed in the IMD layer as illustrated by FIGS. 17A and 17B. Forming the conductive features may include depositing one or more liners 142 along sidewalls and a bottom surface of the openings 140 (see FIGS. 16A and 16B). The liners 142 may comprise TiO, TiN, TaO, TaN, or the like and may provide diffusion barrier, adhesion, and/or seed layers for the conductive feature. The liners may be deposited using any suitable process, such as, PVD, CVD, ALD, and the like.

After the liners 142 are deposited, remaining portions of the opening may be filled with a conductive material 144, such as copper using, e.g., PVD, plating, or the like. The conductive material 144 may be initially deposited to overfill the openings 140 (see FIGS. 16A and 16B), and a planarization process is performed to remove excess portions of the conductive material 144 over the target layer 102. Thus, conductive features may be formed in the target layer 102. In embodiments where the conductive features in the target layer 102 are conductive lines, the sacrificial material 138 (see FIG. 14) defines areas where the conductive lines are cut. By employing the embodiments discussed herein, conductive lines having spacing of 40 nm or less or ever 30 nm or less can be reliably formed with fewer manufacturing defects and increased yield.

FIGS. 18A, 18B, 19A, 19B, 20A, and 20B illustrate cross sectional views of patterning the target layer 102 based on the pattern defined by the spacers 127 and the sacrificial material 138 according to other embodiments. In the embodiments of FIGS. 18A, 18B, 19A, 19B, 20A, and 20B, the target layer 102 is a semiconductor layer or a conductive layer, and the target layer is patterned to define features (e.g., fins and/or gates). Figures ending with the designation "A" refer to a cross-sectional view along line A-A of FIG. 14 while Figures ending with the designation "B" refer to a cross-sectional view along line B-B of FIG. 14.

Figure 18A:
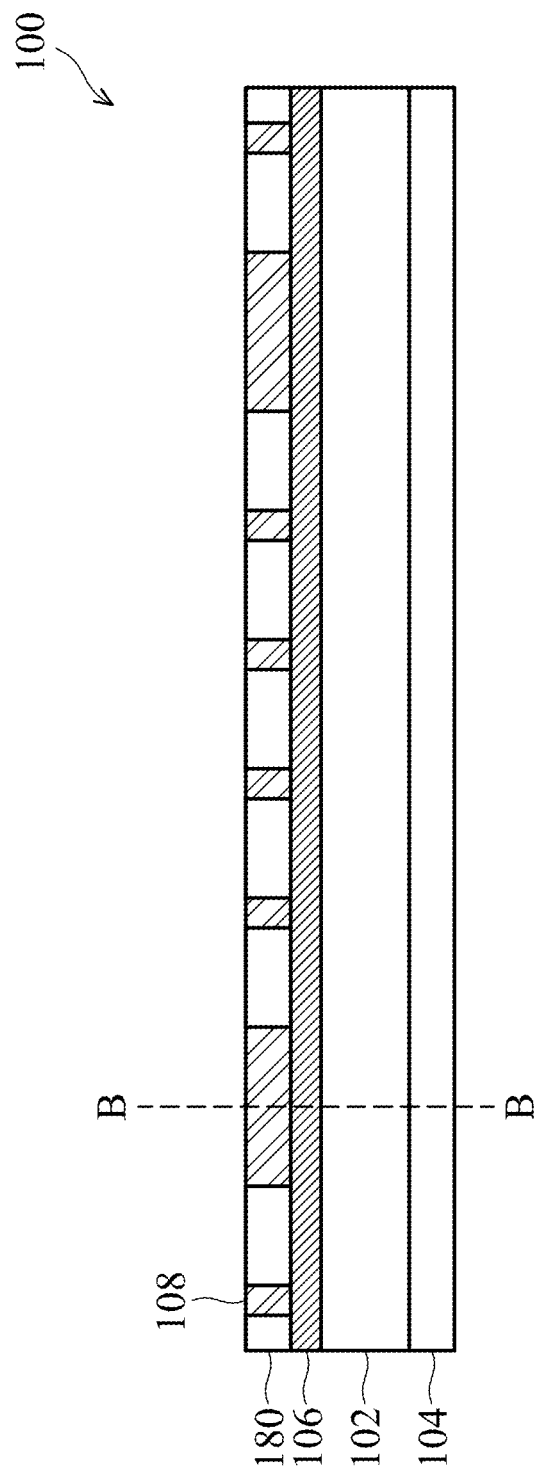
FIGS. 18A, 18B, 19A, 19B, 20A, and 20B illustrate cross-sectional views of various intermediary stages of manufacturing a semiconductor device in accordance with some other embodiments.
Figure 18B:
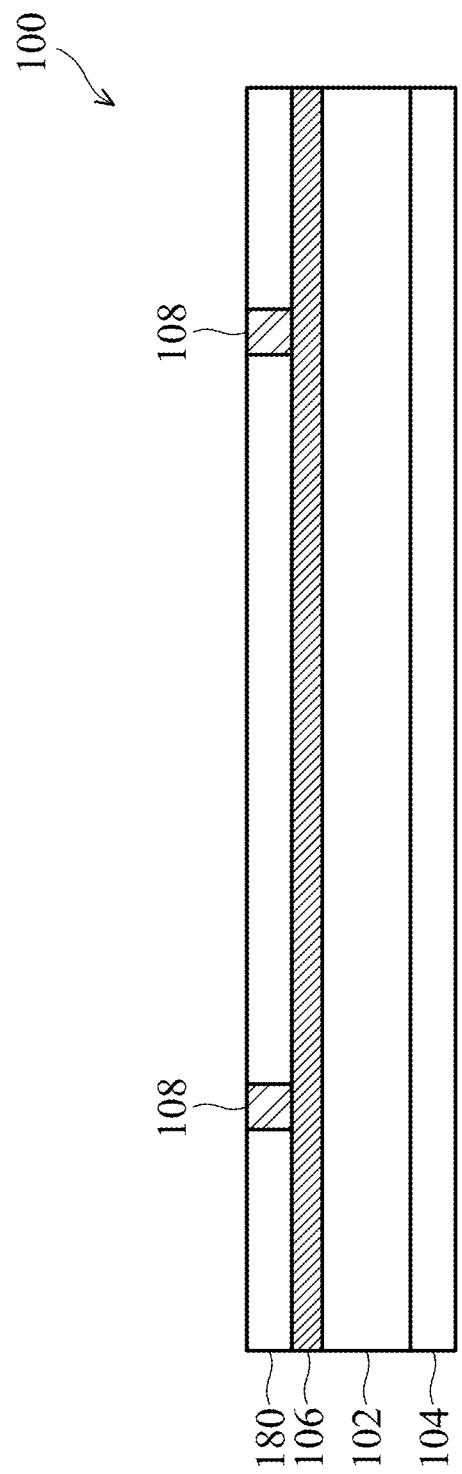

FIGS. 18A and 18B illustrate the device after the hard mask layer 108 is patterned according to embodiment patterning steps. The various processing steps prior to FIG. 18A are the same as discussed above with respect to FIGS. 1 through 15B and are omitted here for brevity.

As further illustrated by FIGS. 18A and 18B, an additional hard mask layer 180 may be deposited after the hard mask layer 108 is patterned. The hard mask layer 180 may be deposited in openings extending through the hard mask layer 108 such that the hard mask layer 180 surrounds the hard mask layer 108. The hard mask layer 180 comprises a metal (e.g., titanium nitride, titanium oxide, titanium, tantalum nitride, tantalum oxide, tantalum, a metal-doped carbide (e.g., tungsten carbide), or the like) and/or a metalloid (e.g., silicon nitride, silicon oxide, boron nitride, silicon carbide, or the like), and may be formed by PVD, Radio Frequency PVD (RFPVD), Atomic Layer Deposition (ALD), or the like. However, the material of the hard mask layer 180 and the hard mask layer 108 are different such that the material of the hard mask layer 180 has etch selectivity to the material of the hard mask layer 108 relative a same etch process. After the hard mask layer 180 is deposited, a planarization process (e.g., a CMP or dry etch process) may be performed to expose the hard mask layer 108.

Figure 19A:
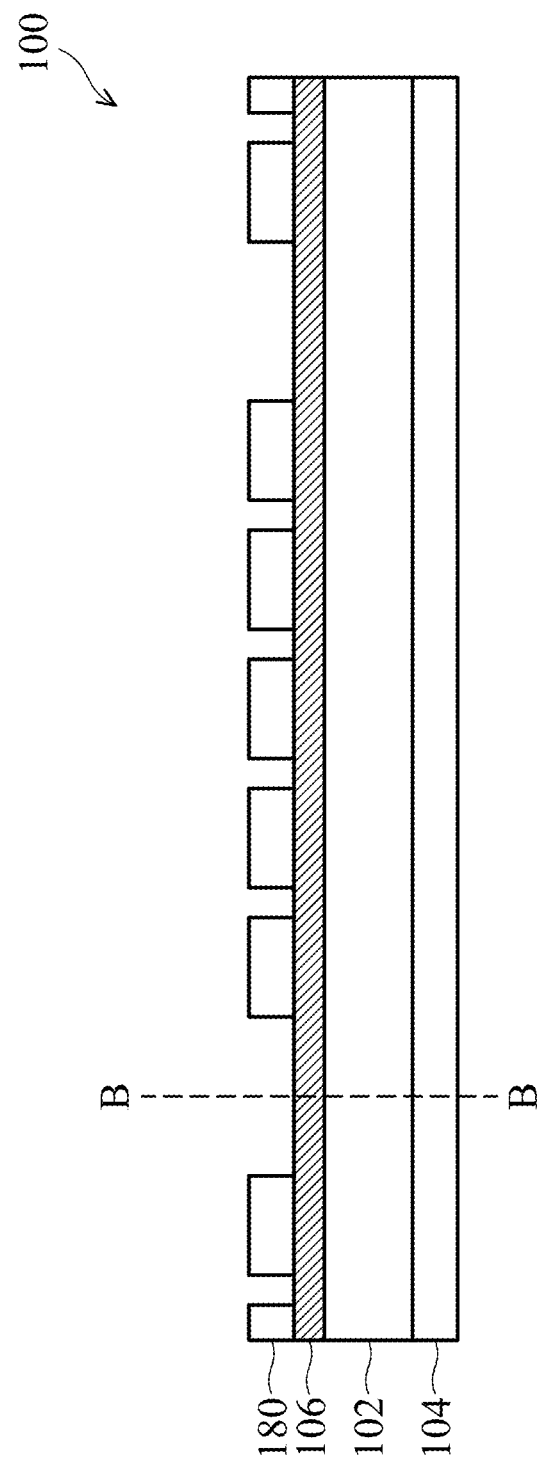
Figure 19B:
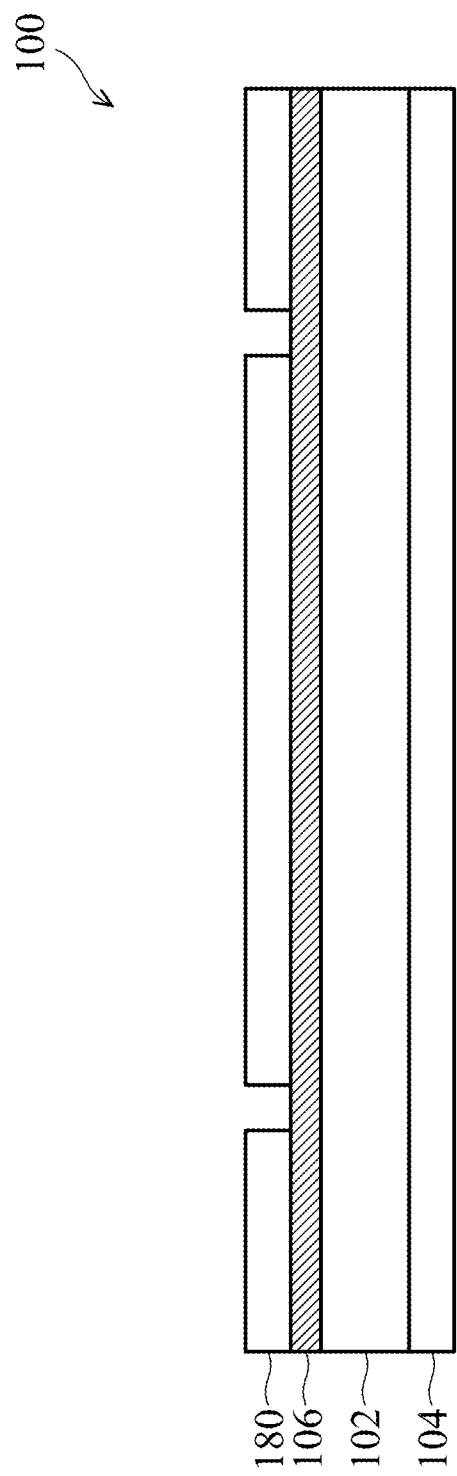

In FIGS. 19A and 19B, the hard mask layer 108 is removed using an appropriate dry and/or wet process. Because the materials of the hard mask layer 108 and the hard mask layer 180 are different and have etch selectivity, the hard mask layer 108 may be removed without significantly removing the hard mask layer 180. Thus, a hard mask layer 180 having a negative (e.g., reversed) pattern as the hard mask layer 108 is provided.

Figure 20A:
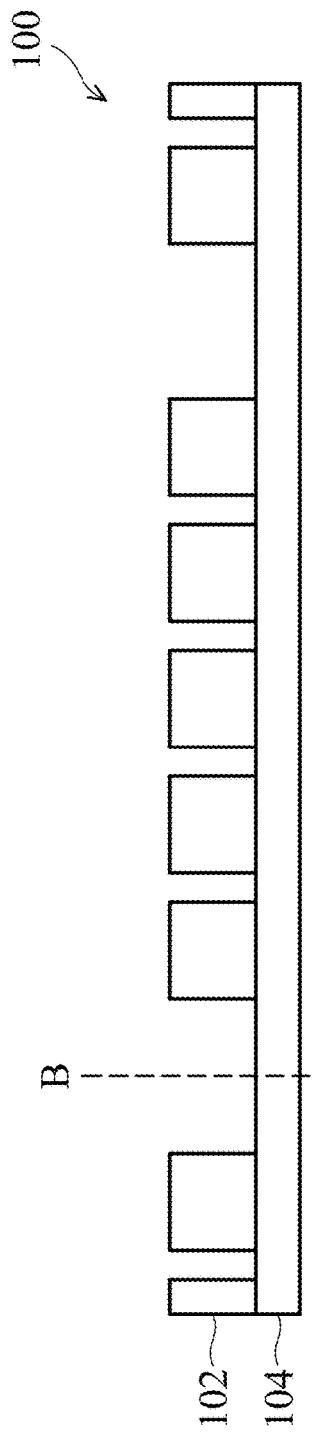
Figure 20B:
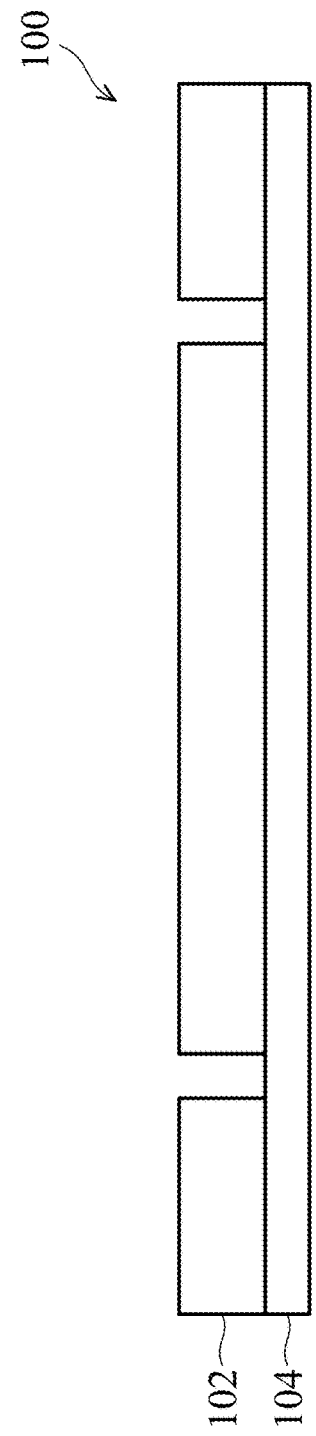

Subsequently, in FIGS. 20A and 20B, the hard mask layer 180 is used as an etching mask to pattern the target layer 102. Etching the target layer 102 may comprise an anisotropic dry etch process and/or a wet etch process, which sequentially etches through the ARC 106 to the target layer 102. Remaining portions of the target layer 102 may have a negative pattern as the spacers 127 and the sacrificial material 138 of FIG. 14. After the target layer 102 is patterned, a wet cleaning may be performed to remove any remaining portions of the hard mask layer 180 and the ARC 106. Thus, fins and/or gate structures can be defined in the target layer 102 when the target layer 102 is a semiconductor layer or a conductive layer.

FIGS. 21A, 21B, 22A, 22B, 23A, 23B, 24A, 24B, 25A, 25B, 26A, 26B, 27A, 27B, 28A, 28B, 29A, 29B, and 30 illustrate cross-sectional views of various intermediary stages of manufacturing a semiconductor device 200 according to some embodiments. Semiconductor device 200 may be similar to semiconductor device 100 where like reference numbers indicate like elements formed using like processes. Throughout FIGS. 21A, 21B, 22A, 22B, 23A, 23B, 24A, 24B, 25A, 25B, 26A, 26B, 27A, 27B, 28A, 28B, 29A, and 29B, figures ending with designation "A" illustrate a same cross-sectional view while figures ending with the designation "B" illustrate a cross-sectional view taken along line B-B of a respective FIGS. 21A, 22A, 23A, 24A, 25A, 26A, 27A, 28A and 29A. For example, FIG. 21B illustrates a cross-sectional view taken along line B-B of FIG. 21A; FIG. 22B illustrates a cross-sectional view taken along line B-B of FIG. 22A; and so forth.

Figure 21A:
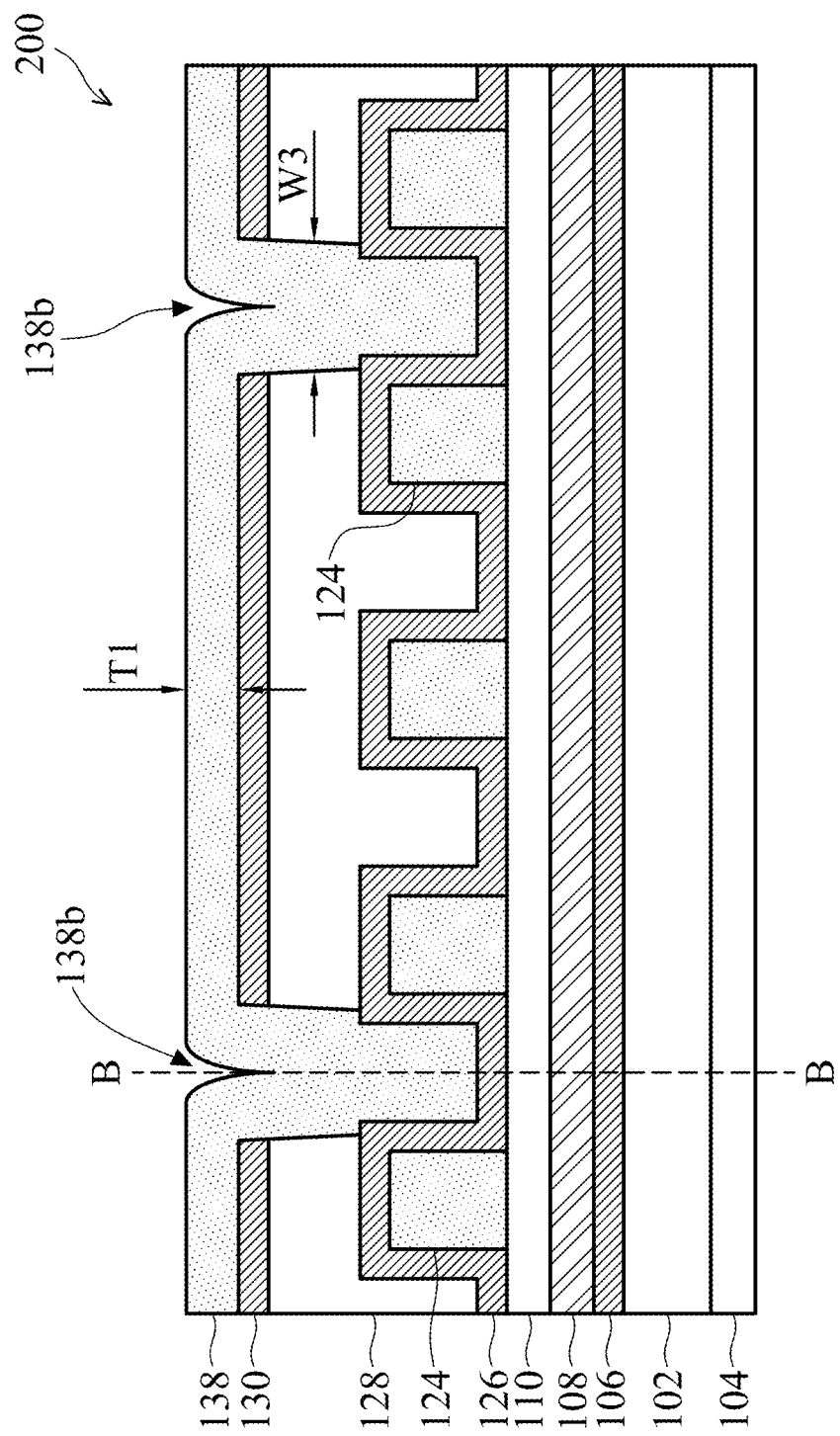
Figure 21B:
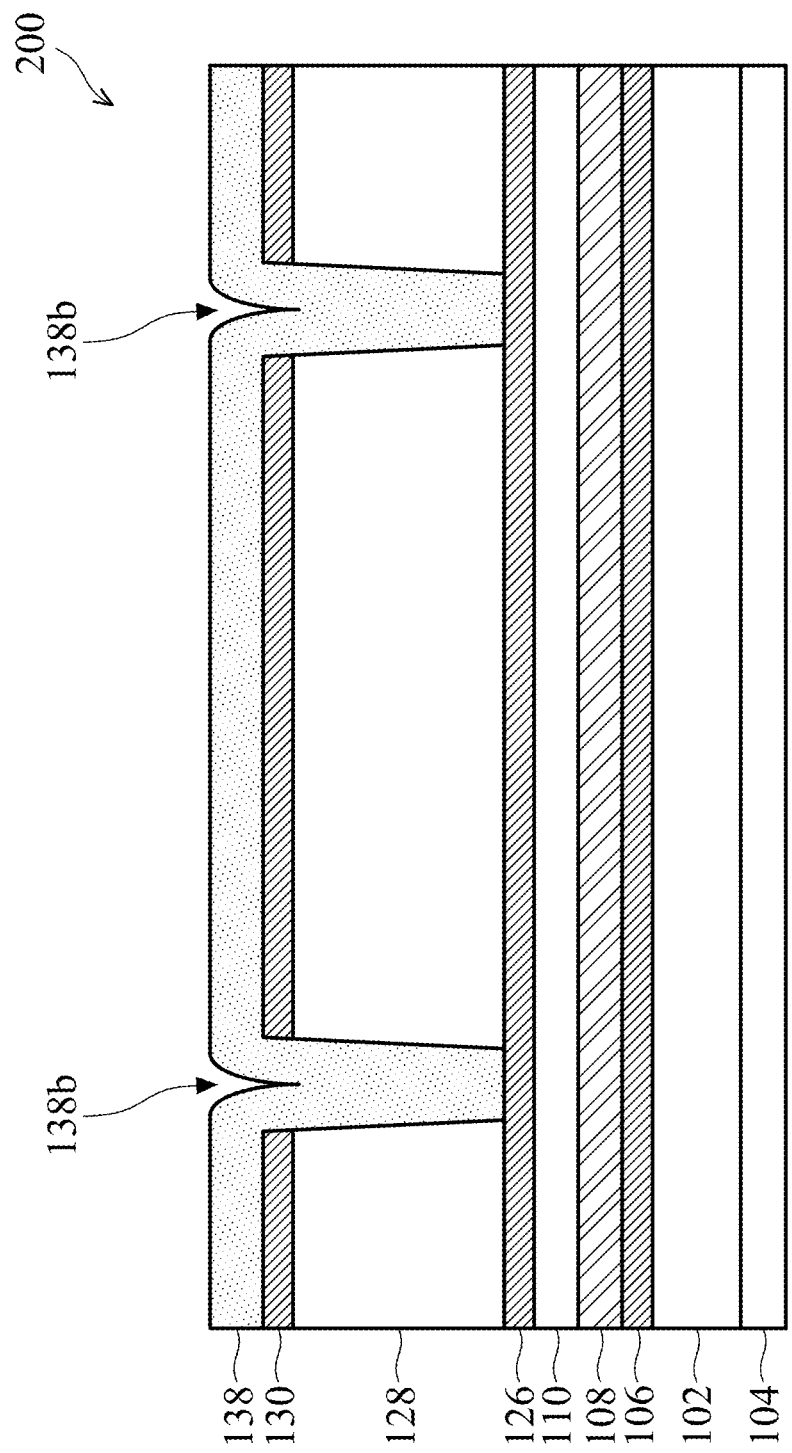

In FIGS. 21A and 21B, a sacrificial material 138 (sometimes also referred to as a reverse material) is deposited over the bottom layer 128 and into the openings 136. Process steps for forming features of the semiconductor device 200 prior to FIGS. 21A and 21B may be substantially the same as the processes described above with respect to FIGS. 1 through 7B, and, thus, additional description of these processes is omitted for brevity. In some embodiments, the sacrificial material 138 is also deposited over the middle layer 130. In other embodiments (not illustrated), the middle layer 130 is removed prior to depositing the sacrificial material 138. Removing the middle layer 130 may include a suitable dry etch process or a combination of dry and wet etch processes. In such embodiments, the sacrificial material 138 may be formed directly on (e.g., in direct contact with) a topmost surface of the bottom layer 128.

In various embodiments, the sacrificial material 138 comprises an inorganic material, such as, titanium oxide, tantalum oxide, silicon oxide, and the like. In some embodiments, the inorganic material is a low temperature oxide (LTO), which is deposited using a relatively low process temperature (e.g., 200° C. or less). In such embodiments, the low temperature deposition process does not cause significant damage to the bottom layer 128. The sacrificial material 138 may be selected to have sufficient etch selectivity to the spacer layer 126 relative a same etch process. For example, a ratio of an etch rate of the sacrificial material 138 to an etch rate of the spacer layer 126 relative a same etch process is at least 0.7 in some embodiments.

The sacrificial material 138 may be formed using a semiconductor film deposition process, such as, CVD, PVD, ALD, or the like. The semiconductor film deposition process may be a conformal process, which forms on sidewalls and a bottom surface of openings 136. As deposition continues, portions of the sacrificial material 138 on opposing sidewalls of the openings 136 may merge, which fills the openings 136. As a result of the semiconductor film deposition process, a top surface of the sacrificial material 138 may not be planar. For example, divots 138b may be present in the top surface of the sacrificial material 138 in and/or over the openings 136. Compared to divots 138a in semiconductor device 100 (see FIGS. 8A and 8B), divots 138b may be larger. For example, divots 138b may extend below a top surface of the middle layer 130 (if present) and/or below a top surface of the bottom layer 128.

Larger divots 138b may be formed by controlling parameters of the deposition process for depositing the sacrificial material 138. For example, the size of divots 138b may be controlled by selecting an appropriate thickness for the sacrificial material 138 versus a width W3 of the openings 136. Generally, a ratio of the thickness T1 of the sacrificial material 138 to a width W3 of an opening 136 is at least 0.5 to allow for sufficient gap filling of the sacrificial material 138 in the opening 136. Furthermore, by increasing this ratio of the thickness T1 to the width W3, the divots 138b (or divots 138a of FIGS. 8A and 8B) become smaller (e.g., shallower and extending less far into the openings 136). In contrast, by decreasing this ration of the thickness T1 to the width W3, the divots 138b (or divots 138A of FIGS. 8A and 8B) become larger (e.g., deeper and extending further into the openings 136). As such, a size of the divots in the sacrificial material 138 may be controlled by controlling a ratio of the thickness T1 to the width W3.

Figure 22A:
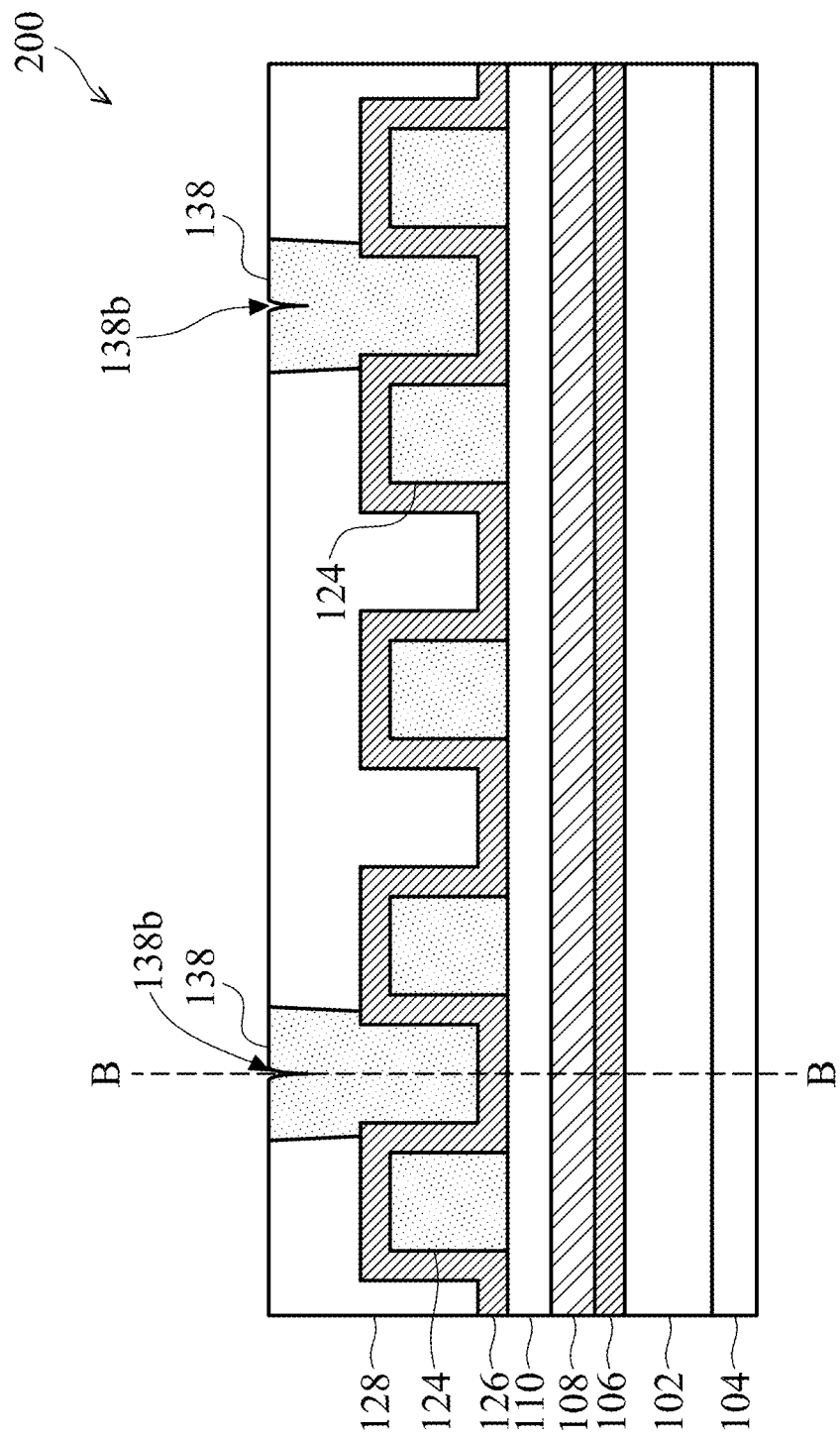
Figure 22B:
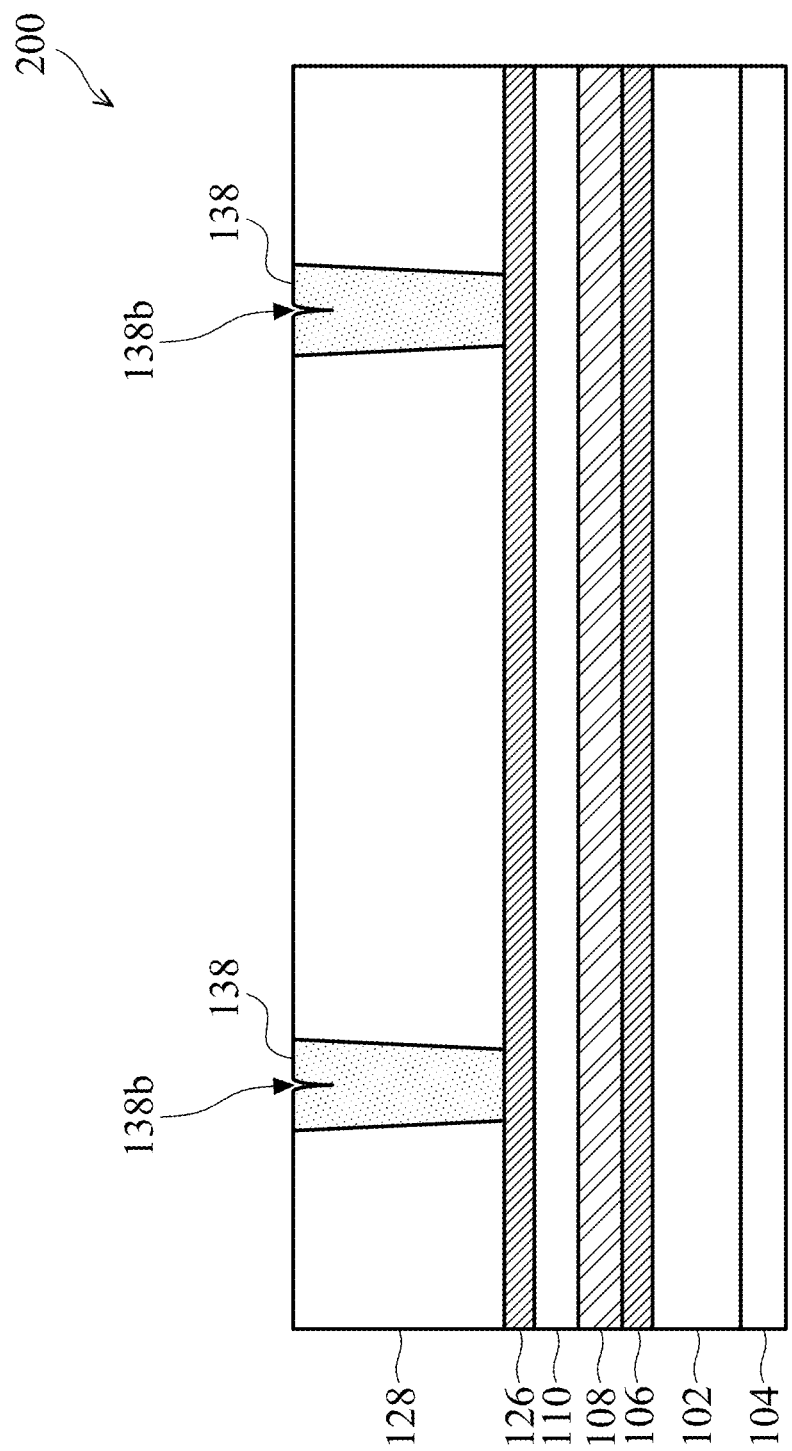

Next, in FIGS. 22A and 22B, a planarization process (e.g., a CMP, dry etch, or the like) is performed to remove excess portions of the sacrificial material 138 outside of the openings 136. In embodiments where the sacrificial material 138 is formed over the middle layer 130, the planarization process may also remove the middle layer 130. After the planarization process, the bottom layer 128 is exposed, and top surfaces of the sacrificial material 138 and the bottom layer 128 may be co-planar. Because divots 138b are relatively large, the planarization process may not remove the divots 138b in the sacrificial material 138. As illustrated in FIGS. 21A and 21B, the divots 138b may remain after the planarization process.

Figure 23A:
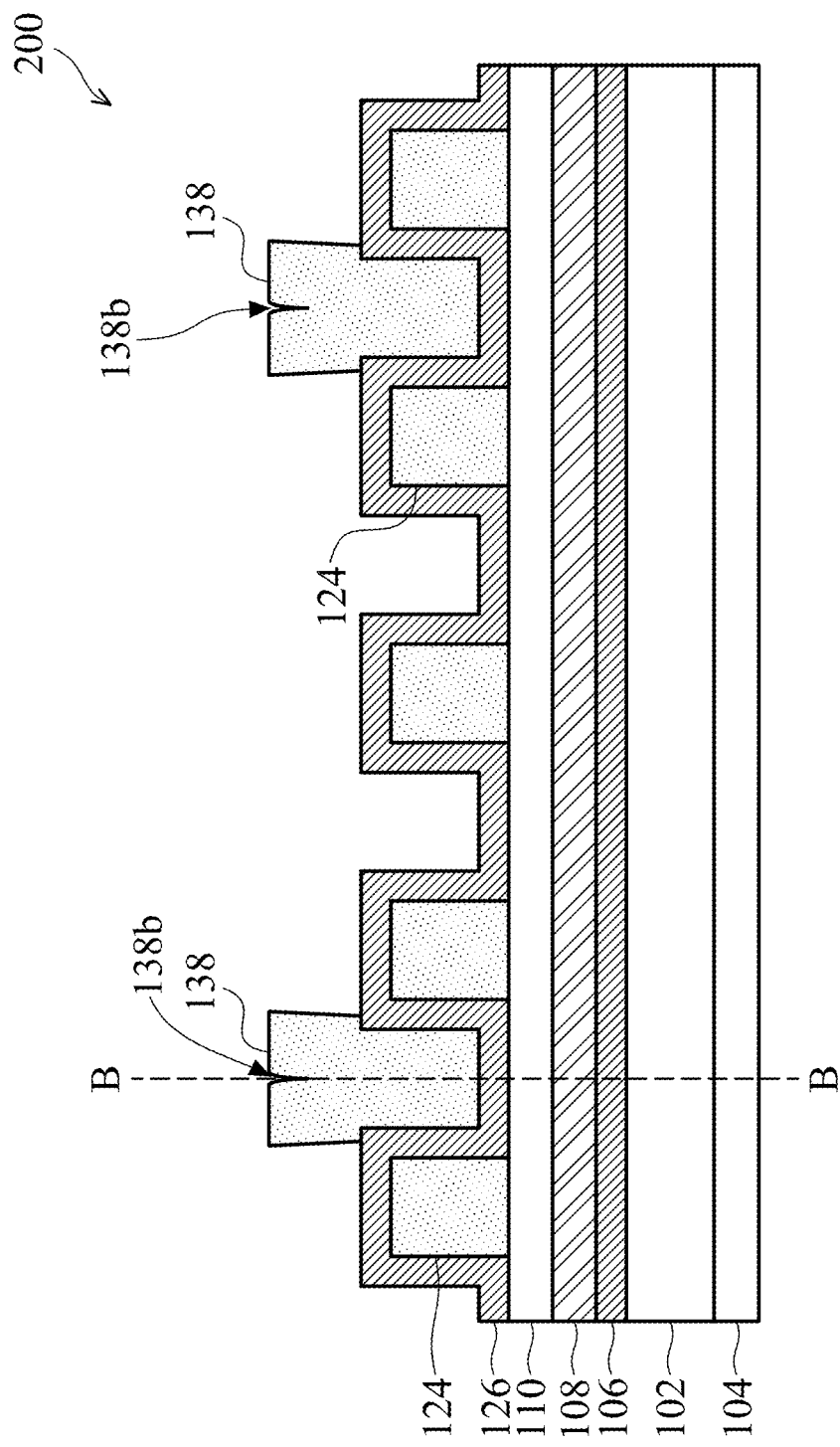
Figure 23B:
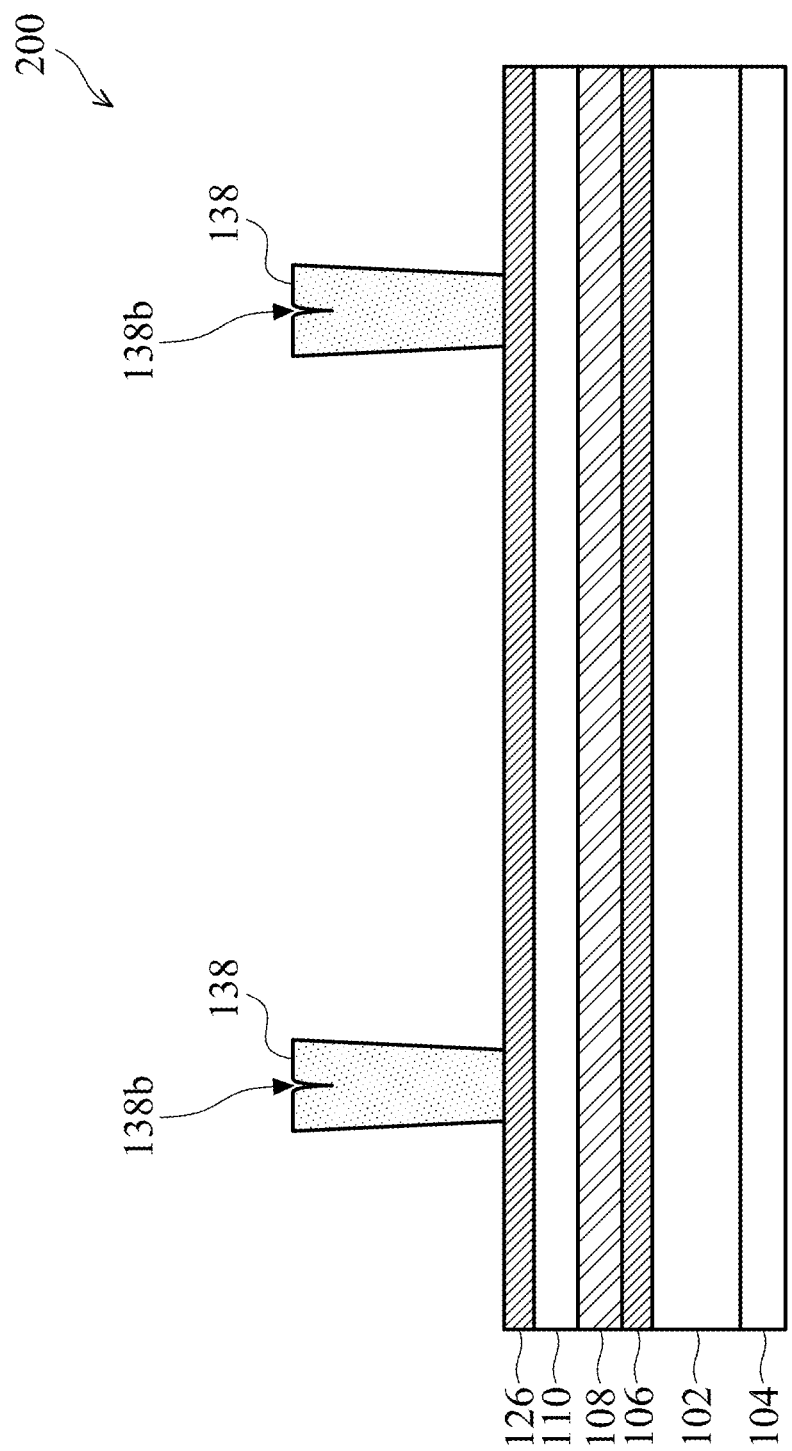

In FIGS. 23A and 23B, the bottom layer 128 is removed using an ashing process. After the bottom layer 128 is removed, pillars of the sacrificial material 138 remain. The remaining sacrificial material 138 mask select areas of the spacer layer 126. In some embodiments, the sacrificial material 138 may span from a first sidewall portion of the spacer layer 126 on a first mandrel 124 to a second sidewall portion of the spacer layer 126 on a second mandrel 124.

Figure 24A:
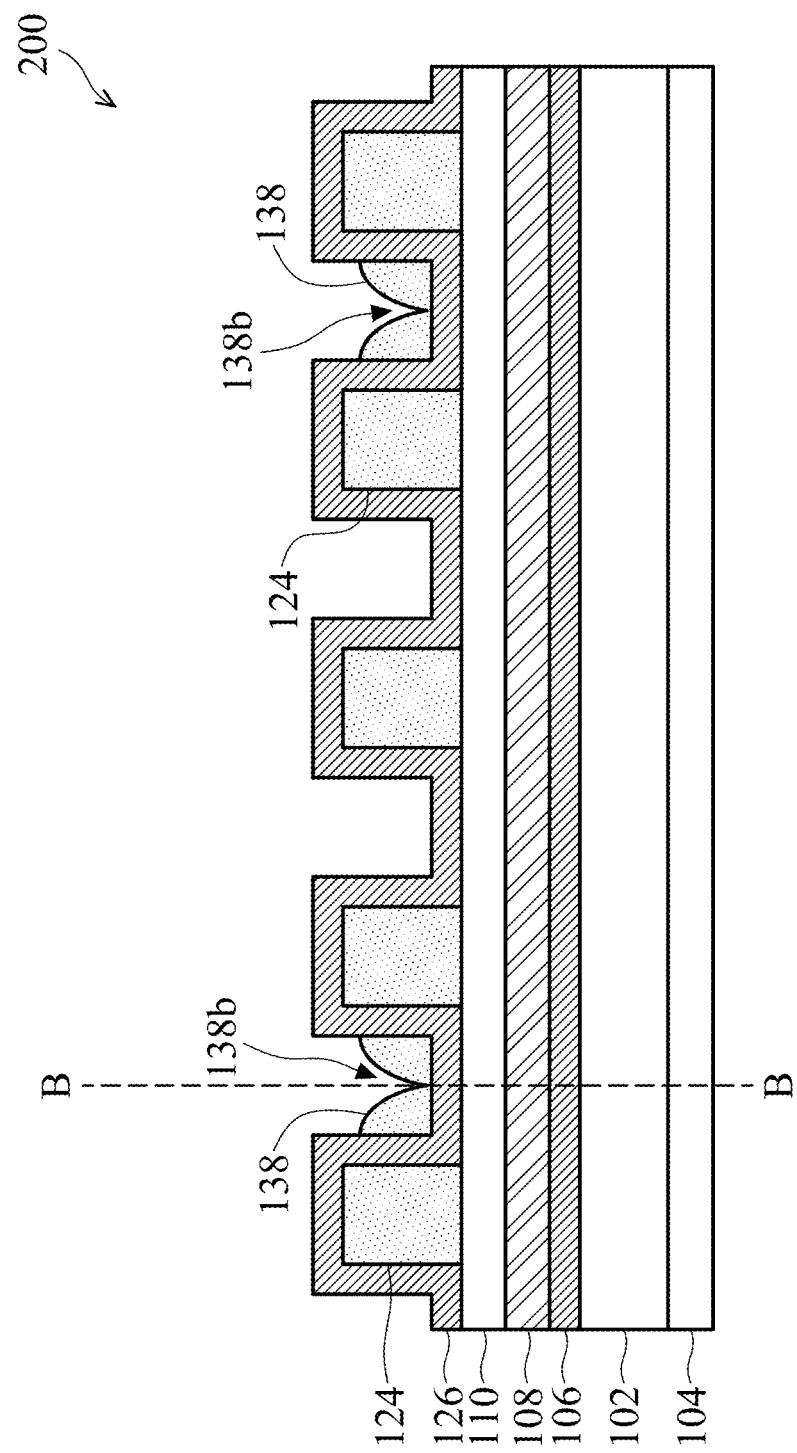
Figure 24B:
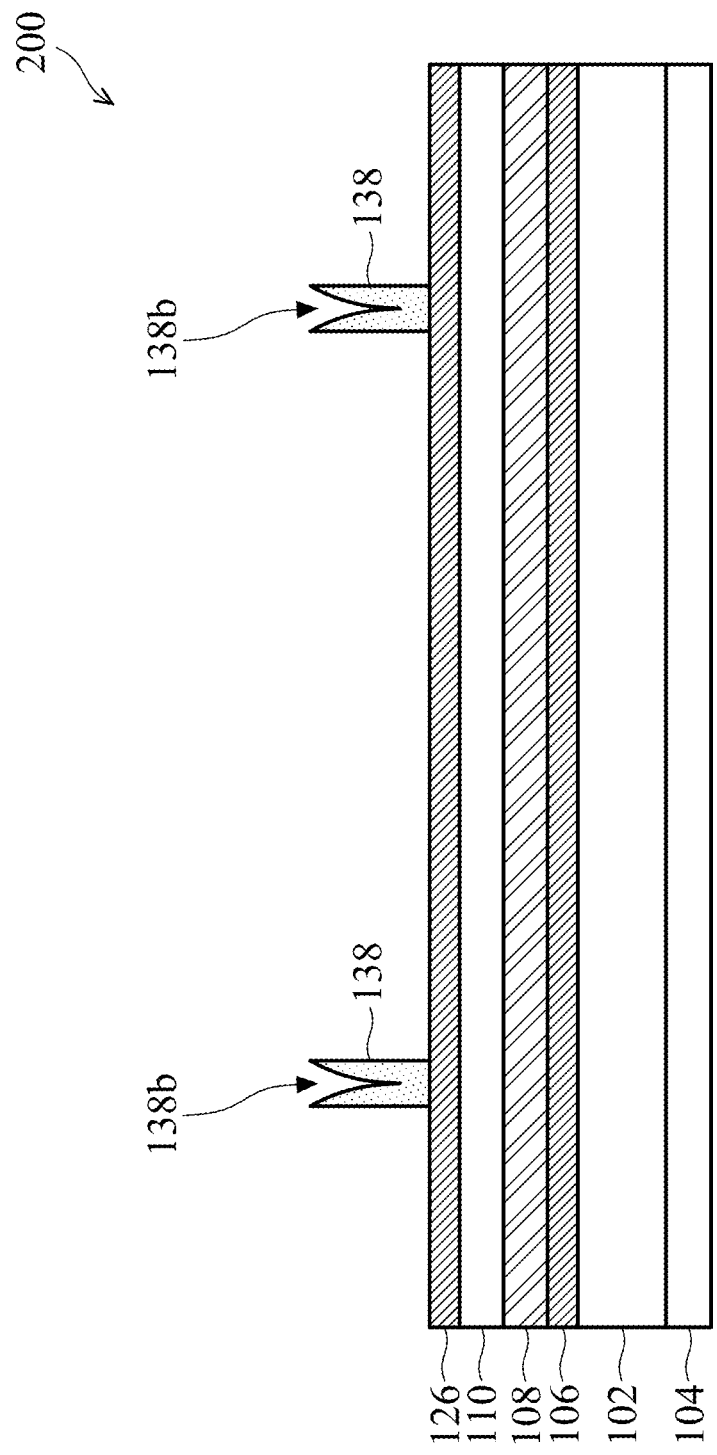

In FIGS. 24A and 24B, the sacrificial material 138 is trimmed in order to achieve a desired profile. In some embodiments, trimming the sacrificial material 138 recesses the sacrificial material 138 below a topmost surface of the spacer layer 126, such as, below a top surface of the mandrels 124. Trimming the sacrificial material 138 may expose portions of the spacer layer 126 over the mandrels 124 (see FIG. 24A). In some embodiments, trimming the sacrificial material 138 further reduces a width of the sacrificial material 138 in at least cross-section B-B (see FIG. 24B). The trimming process may propagate the shape of divots 138b in the trimmed structure. For example, divots 138b remain in sacrificial material 138 after trimming. In some embodiments, the trimming process may even enlarge divots 138b in the trimmed sacrificial material 138. Trimming the sacrificial material 138 may include a dry etch process or a combination of dry and wet etch processes as described above with respect to FIGS. 11A and 11B.

Figure 25A:
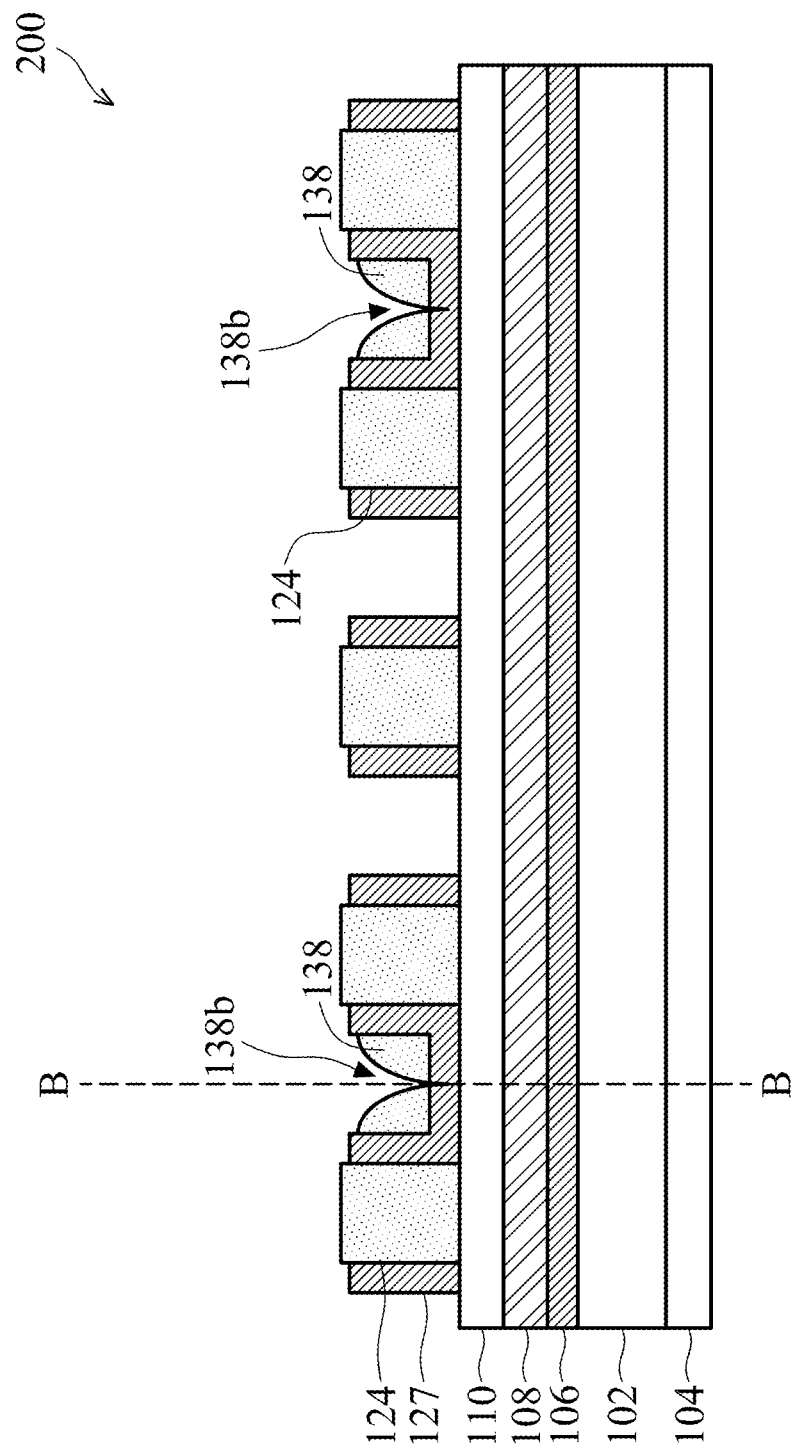
Figure 25B:
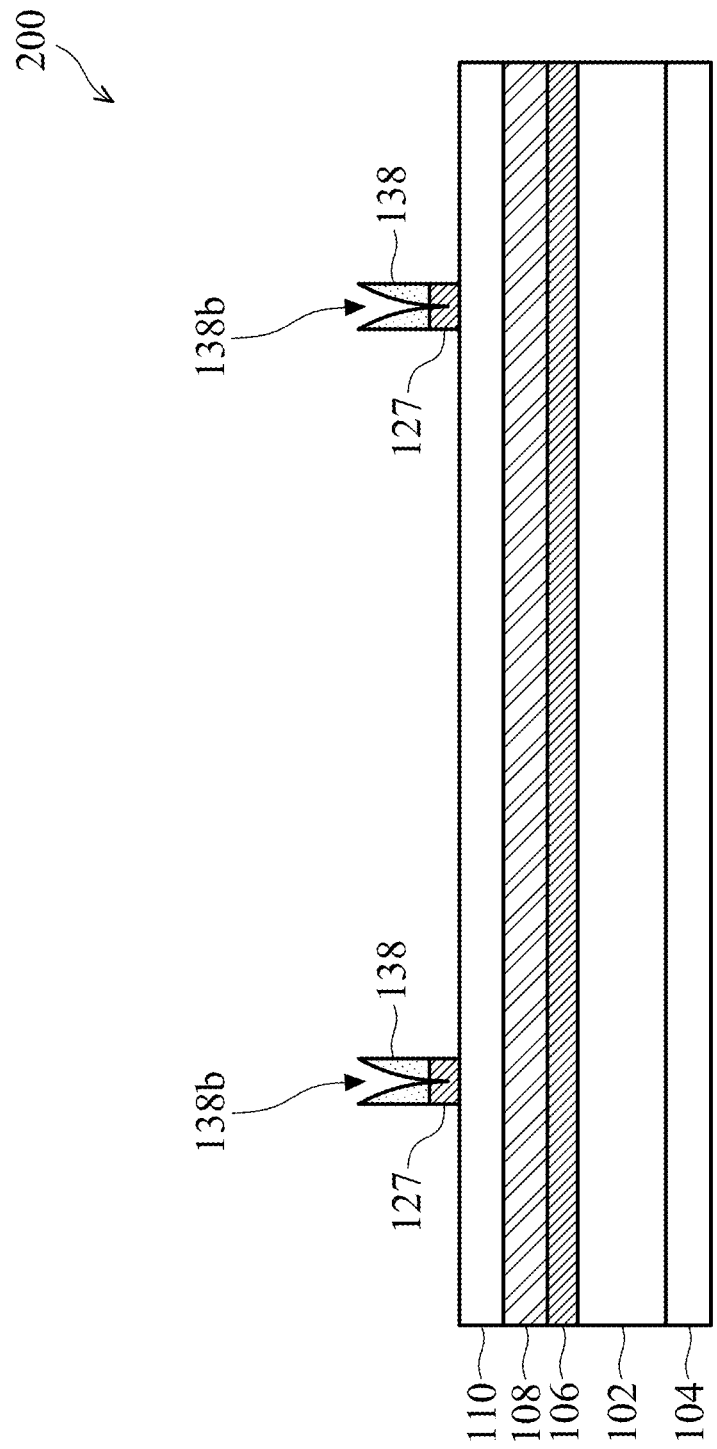

Subsequently, an etching process is performed to remove exposed, horizontal portions of the spacer layer 126 to expose the mandrels 124. The vertical portions of the spacer layer 126 remain after the etching to provide the spacers 127. Furthermore, masked portions of the spacer layer 126 (e.g., areas masked by the sacrificial material 138) may also remain after the etching. However, as a result of divots 138b being present in the sacrificial material 138, portions of the spacer layer 126 underlying the divots 138b may not be sufficiently masked during the spacer etch process. As a result, portions of the spacer layer 126 under the divots 138b may be etched during the spacer etch process. In some embodiments, etching the spacer layer 126 comprises a dry etch process as described above with respect to FIGS. 12A and 12B. The resulting structure is illustrated in FIGS. 25A and 25B.

Figure 26A:
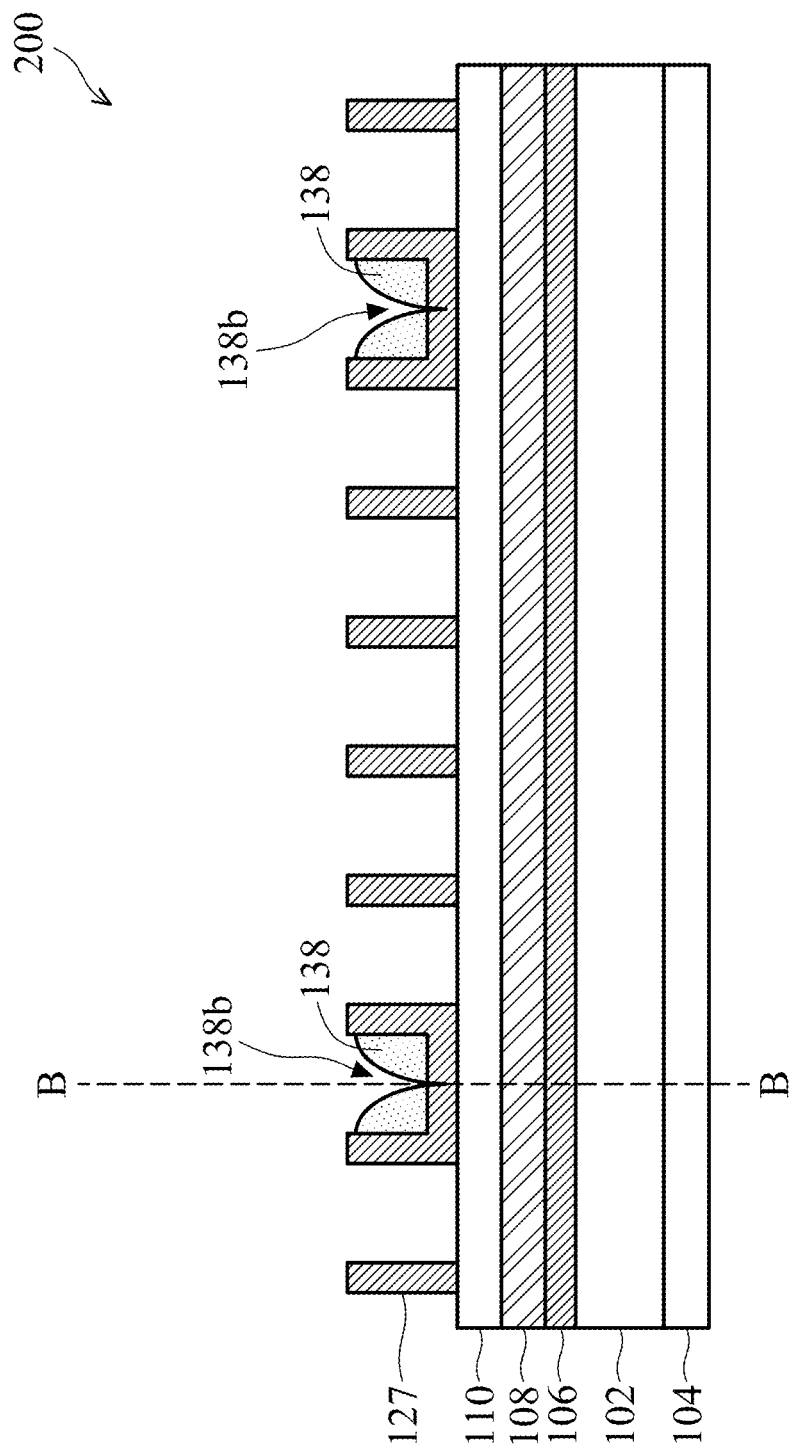
Figure 26B:
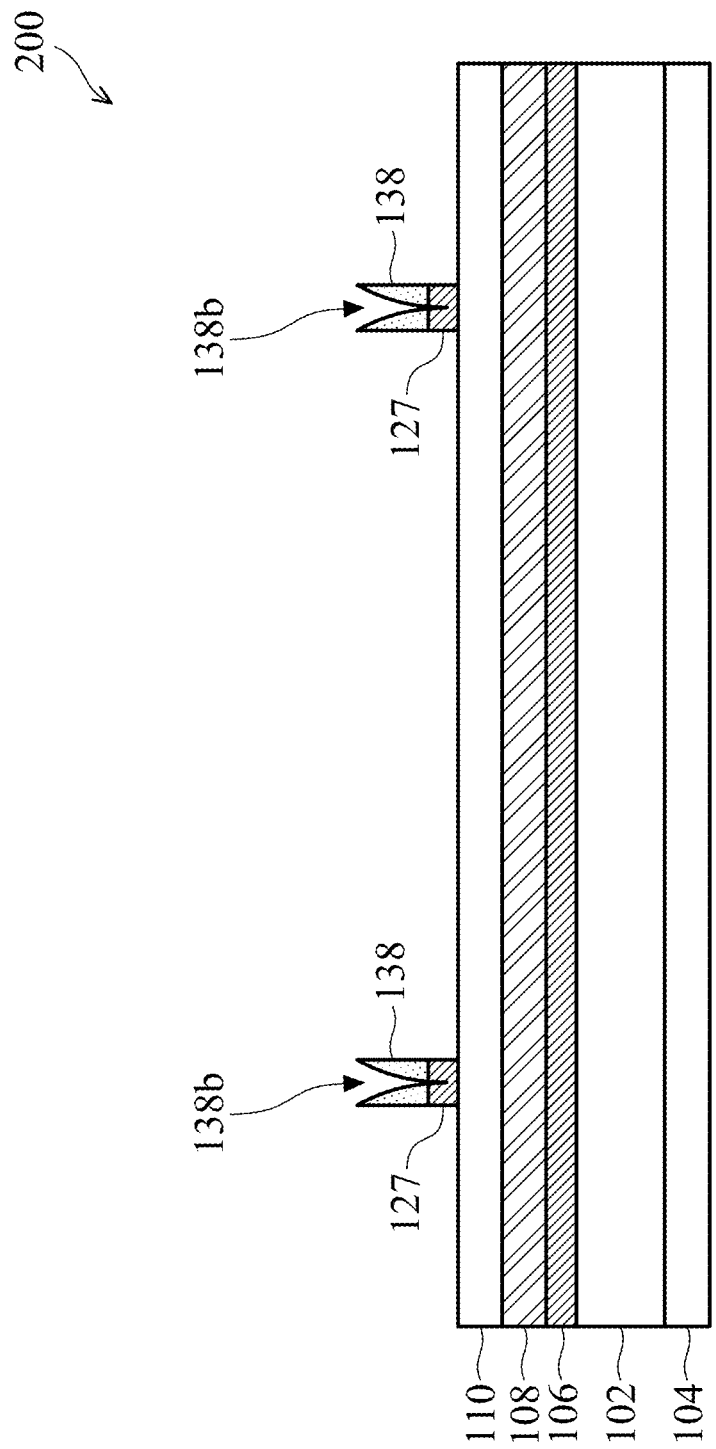

In FIGS. 26A and 26B, the mandrels 124 are removed using an etching process. Because the mandrels 124, the spacer layer 126, and the sacrificial material 138 have etch selectivity relative a same etch process, the mandrels 124 may be removed without removing the spacers 127 or the sacrificial material 138. Etching the mandrels 124 exposes the underlying dielectric layer 110, which may act as an etch stop layer. After the mandrels 124 are removed, the spacers 127 may have a pitch P2. In embodiments where a SADP process as described above is employed, pitch P2 is one half of a minimum pitch achievable by photolithographic processes. The combination of the spacers 127 and the sacrificial material 138 define a pattern for the hard mask layer 108.

Although FIGS. 26A and 26B illustrate all of the mandrels 124 being removed, various embodiments also contemplate the selective removal of the mandrels 124. For example, in certain area (e.g., depending on device layout) of a wafer on which the target layer 102 is formed, mandrels 124 may be not be formed and/or removed. In order to achieve the selective removal of the mandrels 124, a photoresist (not explicitly illustrated) may be deposited over the mandrels 124, the spacers 127, and the sacrificial material 138. The photoresist may be similar to photoresist 120, see FIGS. 1-3, and openings in the photoresist may expose areas where the mandrels 124 are removed while masking other areas of the mandrels 124 from removal. Subsequently, the photoresist may be removed using an ashing step.

Figure 27A:
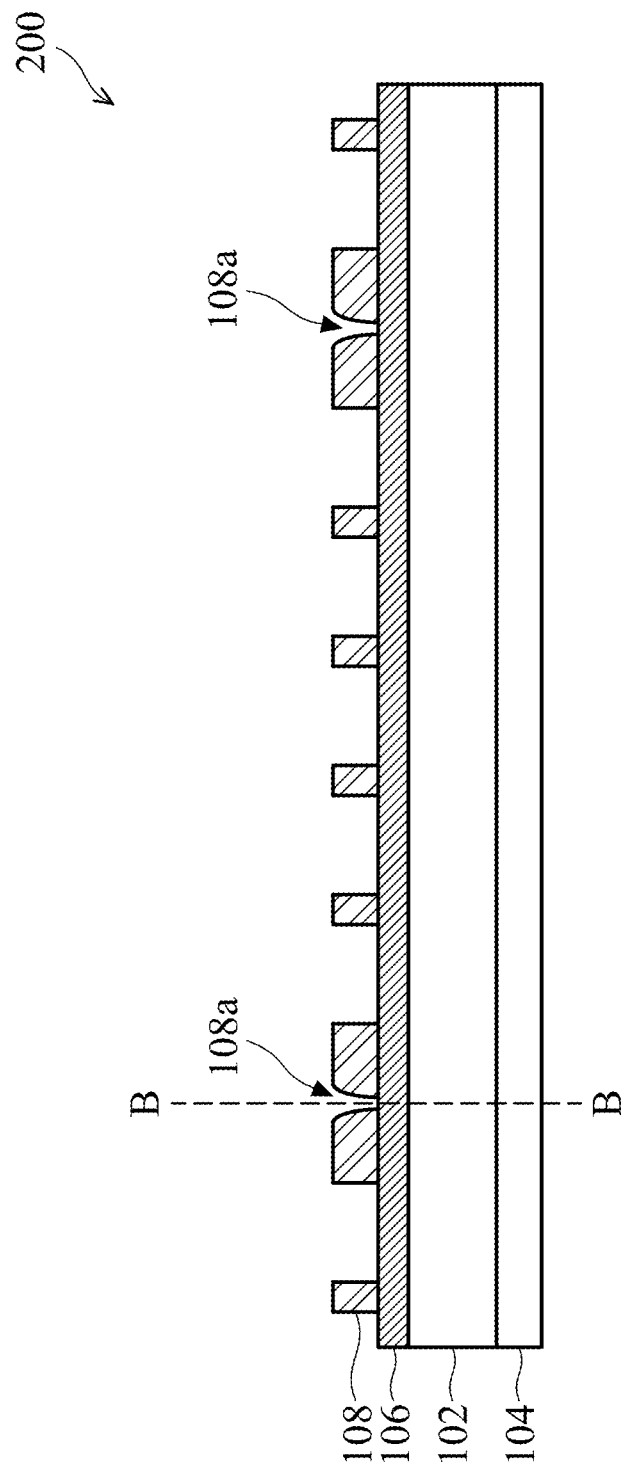
Figure 27B:
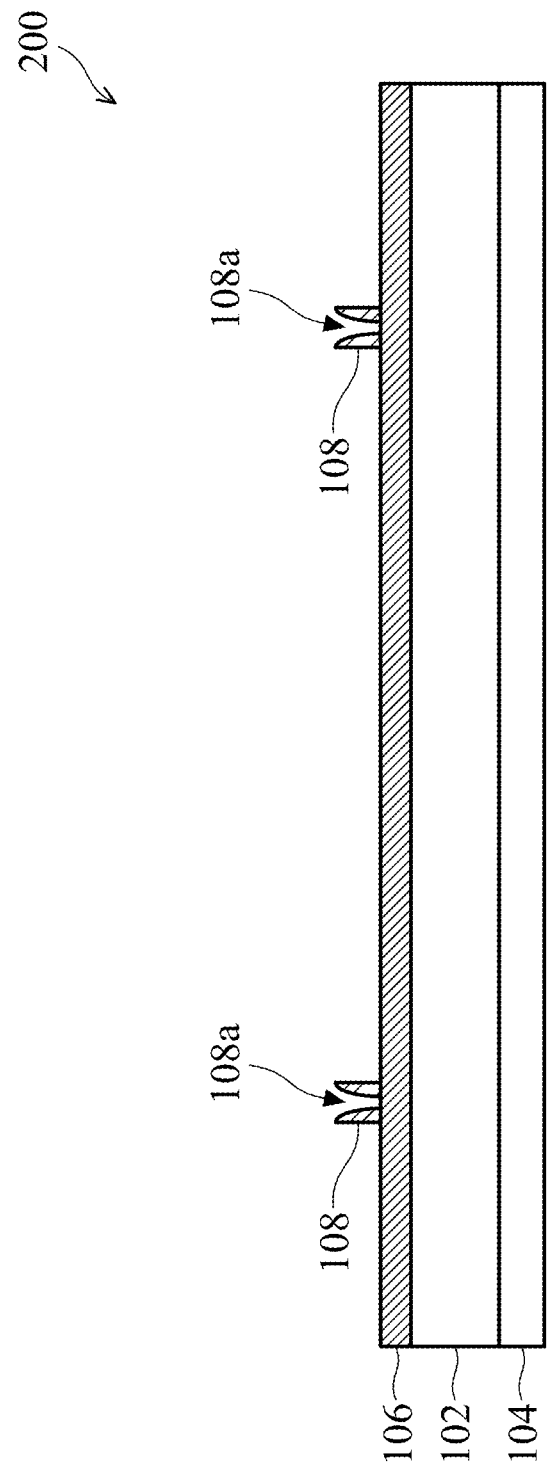

Referring first to FIGS. 27A and 27B, the dielectric layer 110 (see FIGS. 13A and 13B) and the hard mask layer 108 are sequentially etched using the spacers 127 and the sacrificial material 138 as an etching mask. As described above, the sacrificial material 138 are formed with divots 138b, which are carried through various patterning steps. Divots 138b provide areas where sacrificial material 138 is not a strong mask. As a result, areas of the hard mask layer 108 under divots 138b may be at least partially exposed, and such areas under the divots 138b may be patterned. Thus, the hard mask 108 may have openings 108a, which correspond to the divots 138b. The openings 108a may have smaller dimensions than otherwise achievable through photolithography techniques. In some embodiments, etching the hard mask layer 108 comprises an anisotropic dry etch and/or wet etch. After the hard mask layer 108 is patterned, a wet cleaning may be performed to remove any remaining portions of the spacers 127, the sacrificial material 138, and the dielectric layer 110.

In some embodiments as illustrated by FIGS. 28A and 28B, the hard mask layer 108 is used as an etching mask to pattern openings 140 in the target layer 102. Openings 108a in the hard mask layer 108 may allow for the patterning of openings 140a in the target layer 102. Dimensions of the openings 140a (e.g., width) may be smaller than openings 140 in the target layer 102. Etching the target layer 102 may comprise an anisotropic dry etch process and/or a wet etch process, which sequentially etches through the ARC 106 to the target layer 102. Remaining portions of the target layer 102 may have a same pattern as the spacers 127 and the sacrificial material 138. After the openings 140 and 140a are patterned, a wet cleaning may be performed to remove any remaining portions of the hard mask layer 108 and the ARC 106.

Figure 29A:
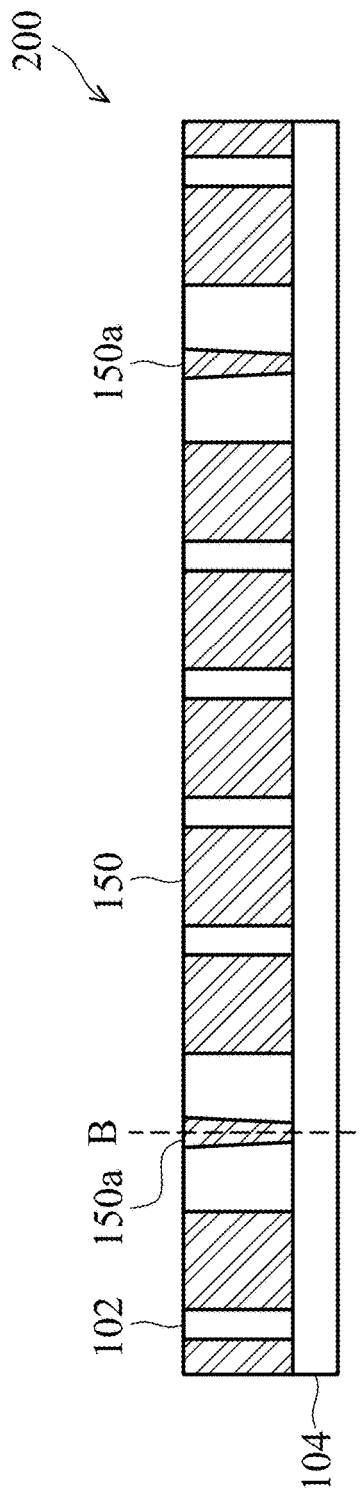
Figure 29B:
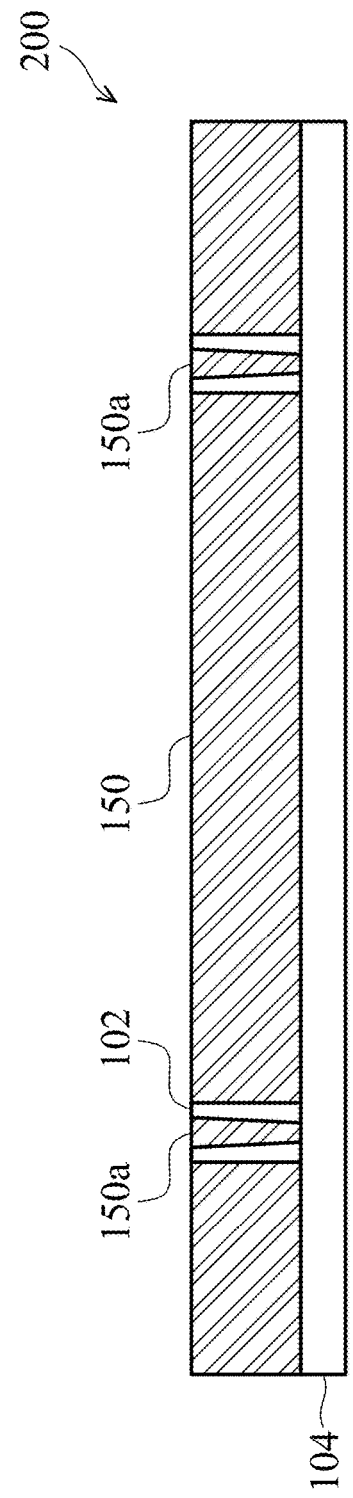

After openings 140 are patterned in the target layer 102, features may be formed in the openings. In an embodiment, the target layer 102 is a low-k dielectric, and the patterned target layer 102 provides an IMD for an interconnect structure. Conductive features 150 such as copper lines, copper vias, and/or cobalt plugs may be formed in the IMD layer as illustrated by FIGS. 29A and 29B. Forming the conductive features 150 may be similar to the formation of liners 142/conductive material 144 as described above with respect to FIGS. 17A and 17B.

In other embodiments where the target layer 102 is a conductive layer or a semiconductor layer, a reverse pattern of the hard mask layer 108 may be patterned in the target layer 102 using a similar process as described above with respect to FIGS. 18A, 18B, 19A, 19B, 20A, and 20B. For example, an additional hard mask may be deposited around the hard mask layer 108; the hard mask layer 108 is then removed, and the additional hard mask is used to pattern the target layer 102. The resulting patterned target layer 102 has a negative pattern than the pattern of the hard mask 108.

Figure 30:
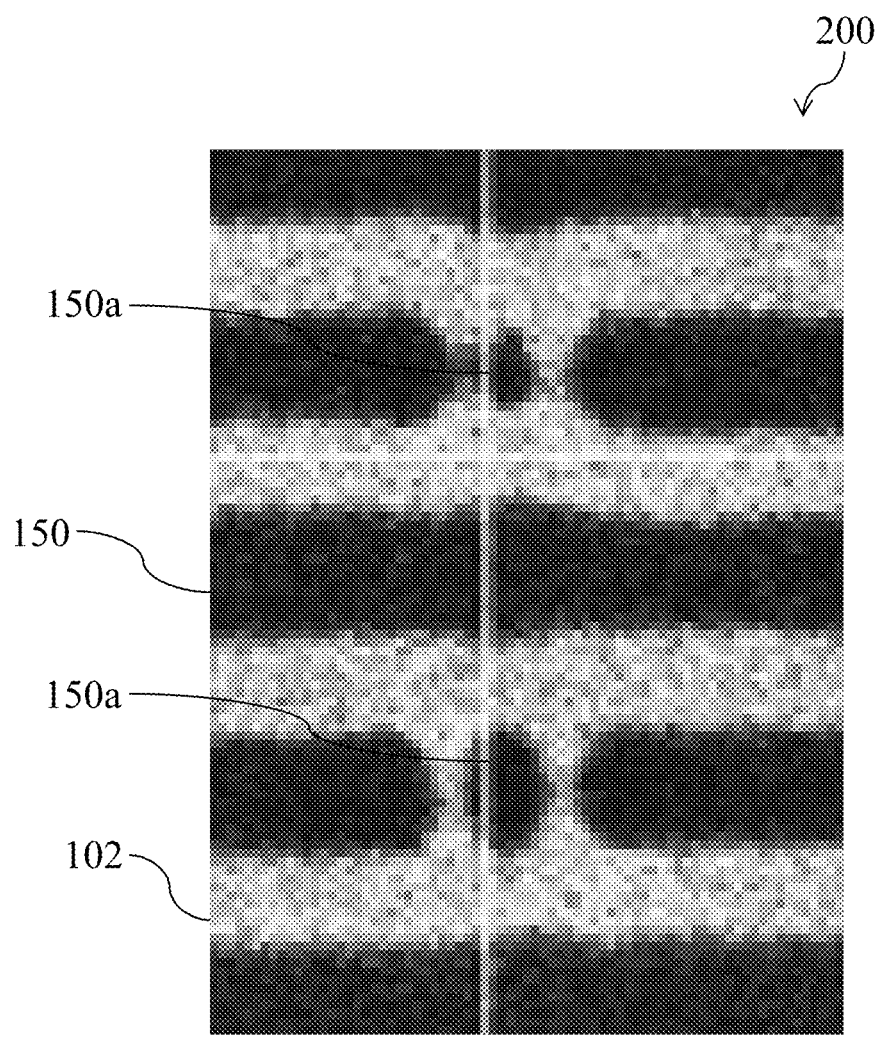

In various embodiments, by intentionally including divots 138b in the sacrificial material and passing the pattern of the divots 138b onto underlying features, small features (e.g., conductive features 150a) can be defined and formed within the target layer 102. For example, FIG. 30 illustrates a top down view of target layer 102 and conductive features 150. As illustrated by FIG. 30, the conductive features 150 are formed in the target layer 102, and conductive features 150a may be defined with a small dimension and be more closely spaced with adjacent features than other features in the target layer 102.

Various embodiments described above provide a patterning process, which uses a semiconductor film deposition process in order to more reliably form a patterned sacrificial material with fewer defects. Thus, fine patterned features can be formed in a target layer with fewer defects and increased yield.

In accordance with an embodiment, a method includes defining a first mandrel and a second mandrel over a hard mask layer. The method also includes depositing a spacer layer over and along sidewalls of the first mandrel and the second mandrel, and forming a sacrificial material over the spacer layer between the first mandrel and the second mandrel. The sacrificial material includes an inorganic oxide. The method further includes removing first horizontal portions of the spacer layer to expose the first mandrel and the second mandrel. Remaining portions of the spacer layer provide spacers on sidewalls of the first mandrel and the second mandrel. The method further includes removing the first mandrel and the second mandrel and patterning the hard mask layer using the spacers and the sacrificial material as an etch mask.

In accordance with an embodiment, a method includes patterning a first opening in a mandrel layer. The mandrel layer is disposed over a target layer. The method also includes depositing a spacer layer over a bottom surface and along sidewalls of the first opening. The method also includes forming a patterned mask over the spacer layer. The patterned mask includes a second opening exposing a portion of the spacer layer on the bottom surface of the first opening. The method also includes depositing a sacrificial material in the second opening using physical vapor deposition (PVD), chemical vapor deposition (CVD), atomic layer deposition (ALD), or a combination thereof. The method also includes removing the patterned mask. The method also includes patterning the spacer layer to provide spacers on sidewalls of the mandrel layer. The method also includes removing the mandrel layer. The method also includes transferring a pattern of the spacers and the sacrificial material to the target layer.

In accordance with an embodiment, a method includes patterning a plurality of mandrels over a hard mask layer. The hard mask layer is disposed over a target layer. The method also includes depositing a spacer layer over and along sidewalls of the plurality of mandrels. The method also includes forming a patterned mask over the spacer layer. The patterned mask including an opening exposing a portion of the spacer layer between adjacent ones of the plurality of mandrels. The method also includes depositing a sacrificial material over the patterned mask in the opening. The sacrificial material includes a divot at a top surface of the sacrificial material. The method also includes removing the patterned mask, and patterning the spacer layer to expose the plurality of mandrels. Sidewall portions of the spacer layer remain along sidewalls of the plurality of mandrels after patterning the spacer layer to expose the plurality of mandrels. The method also includes removing the plurality of mandrels, and patterning the hard mask layer using the sidewall portions of the spacer layer and the sacrificial material as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   defining a first mandrel and a second mandrel over a hard mask layer, a topmost surface of the first mandrel is disposed in a first plane;
   depositing a spacer layer over and along sidewalls of the first mandrel and the second mandrel;
   forming a sacrificial material over the spacer layer between the first mandrel and the second mandrel, wherein the sacrificial material comprises an inorganic oxide, wherein the sacrificial material comprises a divot at a top surface of the sacrificial material, wherein a portion of the sacrificial material in the first plane extends continuously from a first sidewall of the spacer layer to a second sidewall of the spacer layer, the second sidewall of the spacer layer facing the first sidewall of the spacer layer, the first sidewall of the spacer layer and the second sidewall of the spacer layer are both disposed between the first mandrel and the second mandrel;
   removing a first horizontal portion and a second horizontal portion of the spacer layer to expose the first mandrel and the second mandrel, wherein remaining portions of the spacer layer provide spacers on sidewalls of the first mandrel and the second mandrel, wherein the sacrificial material masks a third horizontal portion and a fourth horizontal portion of the spacer layer while removing the first horizontal portion and the second horizontal portion of the spacer layer, and wherein the divot at least partially exposes a fifth horizontal portion of the spacer layer between the third horizontal portion and the fourth horizontal portion while removing the first horizontal portion and the second horizontal portion of the spacer layer;

removing the first mandrel and the second mandrel; and patterning the hard mask layer using the spacers and the sacrificial material as an etch mask.

2. The method of claim 1, wherein forming the sacrificial material comprises:

forming a patterned mask over the spacer layer, the patterned mask comprising an opening exposing a portion of the spacer layer between the first mandrel and the second mandrel;

depositing the sacrificial material in the opening; and removing the patterned mask.

3. The method of claim 2, wherein the sacrificial material is deposited at 200° Celsius or less.

4. The method of claim 2, wherein depositing the sacrificial material comprises a physical vapor deposition (PVD) process, a chemical vapor deposition (CVD) process, an atomic layer deposition (ALD) process, or a combination thereof.

5. The method of claim 2, wherein recessing the sacrificial material from above the topmost surface of the spacer layer to below the topmost surface of the spacer layer is performed after removing the patterned mask.

6. The method of claim 1, wherein a ratio of a first etch rate of the sacrificial material to a second etch rate of the spacer layer relative a same etch process is at least 0.7.

7. The method of claim 1, wherein the sacrificial material comprises titanium oxide, tantalum oxide, silicon oxide, silicon nitride, silicon carbide, or a combination thereof.

8. A method comprising:

patterning a first opening in a mandrel layer, wherein the mandrel layer is disposed over a target layer;

depositing a spacer layer over a bottom surface and along sidewalls of the first opening;

forming a patterned mask over the spacer layer, wherein the patterned mask comprises a second opening exposing a portion of the spacer layer on the bottom surface of the first opening;

depositing a sacrificial material in the second opening using physical vapor deposition (PVD), chemical vapor deposition (CVD), atomic layer deposition (ALD), or a combination thereof, wherein the sacrificial material comprises a divot at a top surface of the sacrificial material, wherein depositing the sacrificial material comprises:

depositing a first portion of the sacrificial material on a first sidewall of the spacer layer exposed by the second opening; and depositing a second portion of the sacrificial material on a second sidewall of the spacer layer exposed by the second opening, the second sidewall facing the first sidewall, the second portion of the sacrificial material is deposited in a direction towards the first portion of the sacrificial material until the first portion of the sacrificial material merges with the second portion of the sacrificial material;

removing the patterned mask;

patterning the spacer layer to provide spacers on sidewalls of the mandrel layer, wherein the sacrificial material masks a first horizontal portion of the spacer layer and a second horizontal portion of the spacer layer while patterning the spacer layer, and wherein the divot at least partially exposes a third horizontal portion of the spacer layer between the first horizontal portion and the second horizontal portion while patterning the spacer layer;

removing the mandrel layer; and transferring a pattern of the spacers and the sacrificial material to the target layer.

9. The method of claim 8, wherein the sacrificial material is an inorganic material.

10. The method of claim 8, wherein forming the patterned mask over the spacer layer comprises:

depositing a bottom layer over the spacer layer; and patterning the second opening through the bottom layer.

11. The method of claim 10 further comprising:

depositing a middle layer over the bottom layer;

patterning the second opening through the middle layer; and prior to depositing the sacrificial material in the second opening, removing the middle layer.

12. The method of claim 10 further comprising:

depositing a middle layer over the bottom layer; and patterning the second opening through the middle layer, wherein depositing the sacrificial material comprises depositing a portion of the sacrificial material over the middle layer.

13. The method of claim 8 further comprising trimming the sacrificial material after removing the patterned mask, wherein trimming the sacrificial material reduces a width of the sacrificial material in at least one cross section.

14. The method of claim 13, wherein trimming the sacrificial material comprises a dry etch process, a wet etch process, or a combination thereof.

15. The method of claim 14, wherein the dry etch process comprises using a carbon-fluro-based etchant, or wherein the wet etch process comprises using diluted hydrofluoric acid as an etchant.

16. A method comprising:

patterning a plurality of mandrels over a hard mask layer;

depositing a spacer layer over and along sidewalls of the plurality of mandrels;

forming a patterned mask over the spacer layer, the patterned mask comprising an opening exposing a portion of the spacer layer between adjacent ones of the plurality of mandrels;

depositing a sacrificial material over the patterned mask in the opening, wherein the sacrificial material comprises a divot at a top surface of the sacrificial material;

removing the patterned mask, wherein removing the patterned mask comprises an ashing process performed after depositing the sacrificial material;

patterning the spacer layer to expose the plurality of mandrels, wherein sidewall portions of the spacer layer remain along sidewalls of the plurality of mandrels after patterning the spacer layer to expose the plurality of mandrels, wherein the sacrificial material masks a first horizontal portion of the spacer layer and a second horizontal portion of the spacer layer while patterning the spacer layer, and wherein the divot at least partially exposes a third horizontal portion of the spacer layer between the first horizontal portion and the second horizontal portion while patterning the spacer layer;

removing the plurality of mandrels; and patterning the hard mask layer using the sidewall portions of the spacer layer and the sacrificial material as an etch mask.

17. The method of claim 16 further comprising patterning the sacrificial material after removing the patterned mask, wherein the divot remains in the sacrificial material after patterning the sacrificial material.

18. The method of claim 16, wherein the sacrificial material is an inorganic material, and wherein depositing the sacrificial material comprises a physical vapor deposition (PVD) process, a chemical vapor deposition (CVD) process, an atomic layer deposition (ALD) process, or a combination thereof.

* * * * *